US008507382B2

(12) United States Patent
Hughes et al.

(10) Patent No.: US 8,507,382 B2
(45) Date of Patent: Aug. 13, 2013

(54) SYSTEMS AND METHODS FOR DELIVERY OF FLUID-CONTAINING PROCESS MATERIAL COMBINATIONS

(75) Inventors: John E. Q. Hughes, Phoenix, AZ (US);
Donald D. Ware, Woodbury, MN (US);
Steven M. Lurcott, Sherman, CT (US);
Peter Wrschka, Phoenix, AZ (US)

(73) Assignee: Foresight Processing, LLC, Tempe, AZ (US)

( * ) Notice: Subject to any disclaimer, the term of this patent is extended or adjusted under 35 U.S.C. 154(b) by 331 days.

(21) Appl. No.: 12/745,748

(22) PCT Filed: Dec. 8, 2008

(86) PCT No.: PCT/US2008/085826
§ 371 (c)(1),
(2), (4) Date: Aug. 23, 2010

(87) PCT Pub. No.: WO2009/076276
PCT Pub. Date: Jun. 18, 2009

(65) Prior Publication Data
US 2011/0008964 A1    Jan. 13, 2011

Related U.S. Application Data

(60) Provisional application No. 60/992,988, filed on Dec. 6, 2007.

(51) Int. Cl.
*H01L 21/302* (2006.01)
(52) U.S. Cl.
USPC ............. 438/692; 451/60; 137/88; 137/263

(58) Field of Classification Search
USPC ............. 137/88, 92, 93, 263, 266; 222/318;
451/446, 60; 438/689–695, 697–699
See application file for complete search history.

(56) References Cited

U.S. PATENT DOCUMENTS

| | | | |
|---|---|---|---|
| 5,125,533 A | 6/1992 | Gayer et al. | |
| 5,148,945 A * | 9/1992 | Geatz | 222/318 |
| 6,017,463 A | 1/2000 | Woo et al. | |
| 6,019,250 A | 2/2000 | Pozniak et al. | |
| 6,048,256 A | 4/2000 | Obeng | |
| 6,125,876 A * | 10/2000 | Laederich et al. | 137/263 |

(Continued)

FOREIGN PATENT DOCUMENTS

| | | |
|---|---|---|
| KR | 2000-0046823 A | 7/2000 |
| KR | 2001-0025870 A | 4/2001 |

(Continued)

OTHER PUBLICATIONS

Supplementary European Search Report issued on Jun. 8, 2012 in European Patent Application No. 08859933.7.

*Primary Examiner* — Eric Keasel
(74) *Attorney, Agent, or Firm* — Vincent K. Gustafson; Jenkins, Wilson, Taylor & Hunt, P.A.

(57) ABSTRACT

Common sources of different (e.g., concentrated) process materials are controllably supplied to multiple blending manifolds associated with multiple process tools, processing stations, or other points of use, to create an independently controllable process material blend for each tool, station, or point of use. Multi-constituent process materials may be circulated from a supply container through a blending manifold to a return container to ensure homogeneity until immediately prior to blending and use. Such containers may include liner-based containers adapted for pressure dispensation.

19 Claims, 23 Drawing Sheets

(56) References Cited

U.S. PATENT DOCUMENTS

| | | |
|---|---|---|
| 6,293,849 B1 | 9/2001 | Kawashima et al. |
| 6,348,124 B1 | 2/2002 | Garbett et al. |
| 6,352,469 B1 | 3/2002 | Miyazaki et al. |
| 6,358,125 B2 | 3/2002 | Kawashima et al. |
| 6,395,194 B1 | 5/2002 | Russell et al. |
| 6,579,798 B2 | 6/2003 | Chatterjee et al. |
| 6,616,014 B1 | 9/2003 | Pozniak et al. |
| 6,656,015 B2 | 12/2003 | Mayes |
| 6,679,764 B2 | 1/2004 | Finkenzeller et al. |
| 6,698,619 B2 | 3/2004 | Wertenberger |
| 6,699,402 B2 | 3/2004 | Russell et al. |
| 6,764,378 B2 | 7/2004 | Mayes |
| 6,796,703 B2 | 9/2004 | Lemke |
| 6,802,762 B2 | 10/2004 | Tanaka et al. |
| 6,814,835 B2 | 11/2004 | Kim et al. |
| 6,879,876 B2 | 4/2005 | O'Dougherty et al. |
| 6,884,145 B2 | 4/2005 | Lujan et al. |
| 6,910,954 B2 | 6/2005 | Kim et al. |
| 6,923,568 B2 | 8/2005 | Wilmer et al. |
| 6,942,123 B2 | 9/2005 | Wertenberger |
| 7,025,234 B2 | 4/2006 | Priebe et al. |
| 7,114,517 B2 | 10/2006 | Sund et al. |
| 7,166,018 B2 | 1/2007 | Tanoue et al. |
| 7,188,644 B2 | 3/2007 | Kelly et al. |
| 7,204,679 B2 | 4/2007 | Wheeler |
| 7,232,360 B2 | 6/2007 | Gadd |
| 7,258,598 B2 | 8/2007 | Iwasaki et al. |
| 7,275,928 B2 | 10/2007 | Kolesar et al. |
| 7,331,844 B2 | 2/2008 | Tanoue et al. |
| 7,338,352 B2 | 3/2008 | Seong et al. |
| 7,344,298 B2 | 3/2008 | Wilmer et al. |
| 2002/0048213 A1 | 4/2002 | Wilmer et al. |
| 2004/0106355 A1 | 6/2004 | Lujan et al. |
| 2006/0212233 A1* | 9/2006 | Wong et al. ............... 702/50 |
| 2010/0128555 A1 | 5/2010 | Hughes |

FOREIGN PATENT DOCUMENTS

| | | |
|---|---|---|
| WO | 2006116389 A2 | 11/2006 |
| WO | 2006116572 A2 | 11/2006 |
| WO | 2006133249 A2 | 12/2006 |
| WO | 2008095078 A1 | 8/2008 |
| WO | 2008141206 A2 | 11/2008 |

* cited by examiner

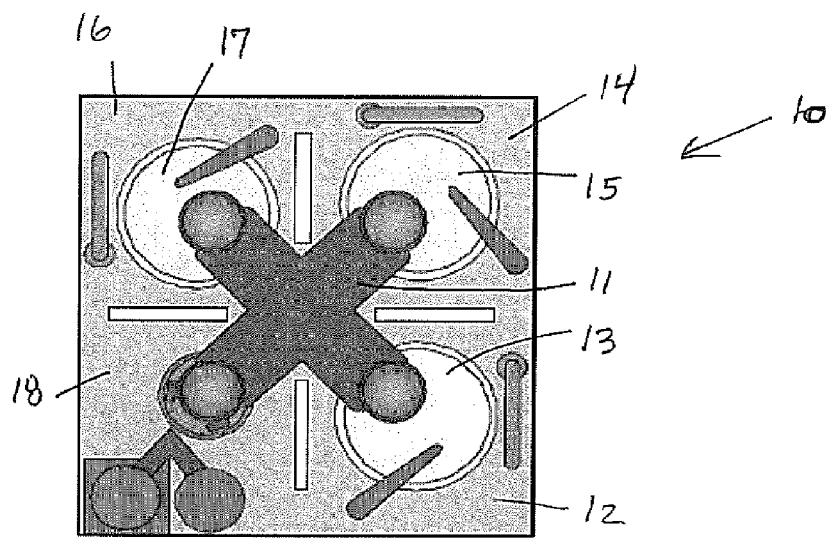
FIG._1A
(PRIOR ART)
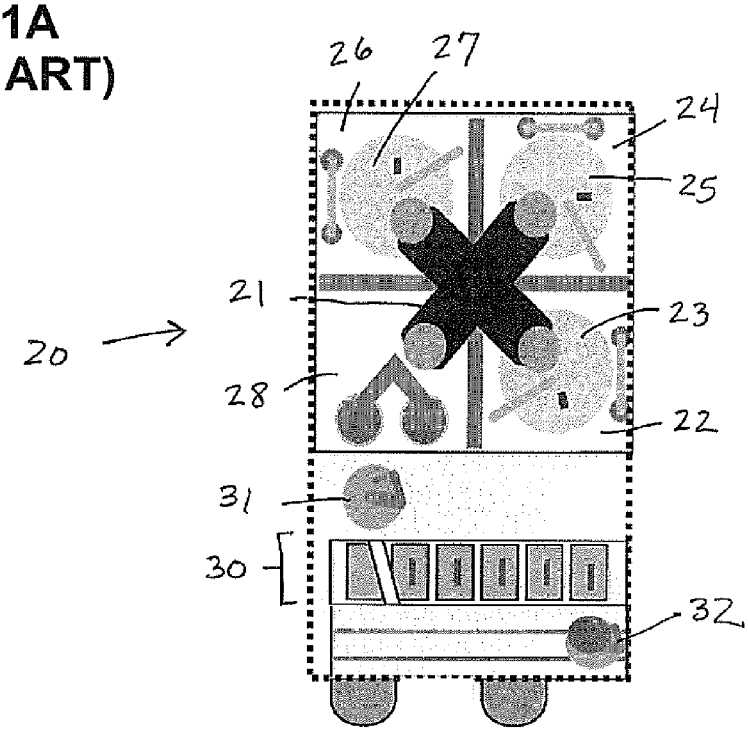
FIG._1B
(PRIOR ART)

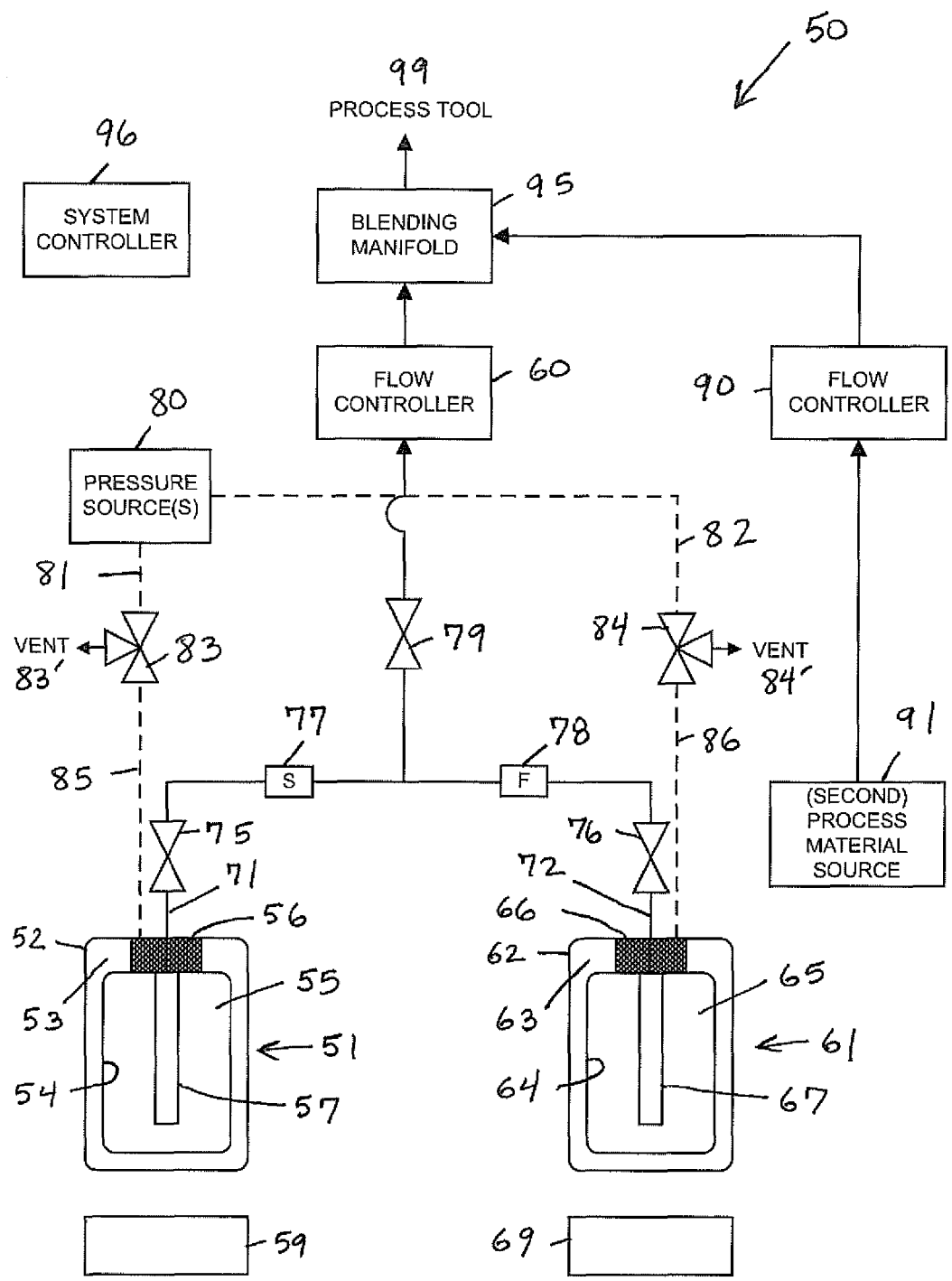
FIG._3

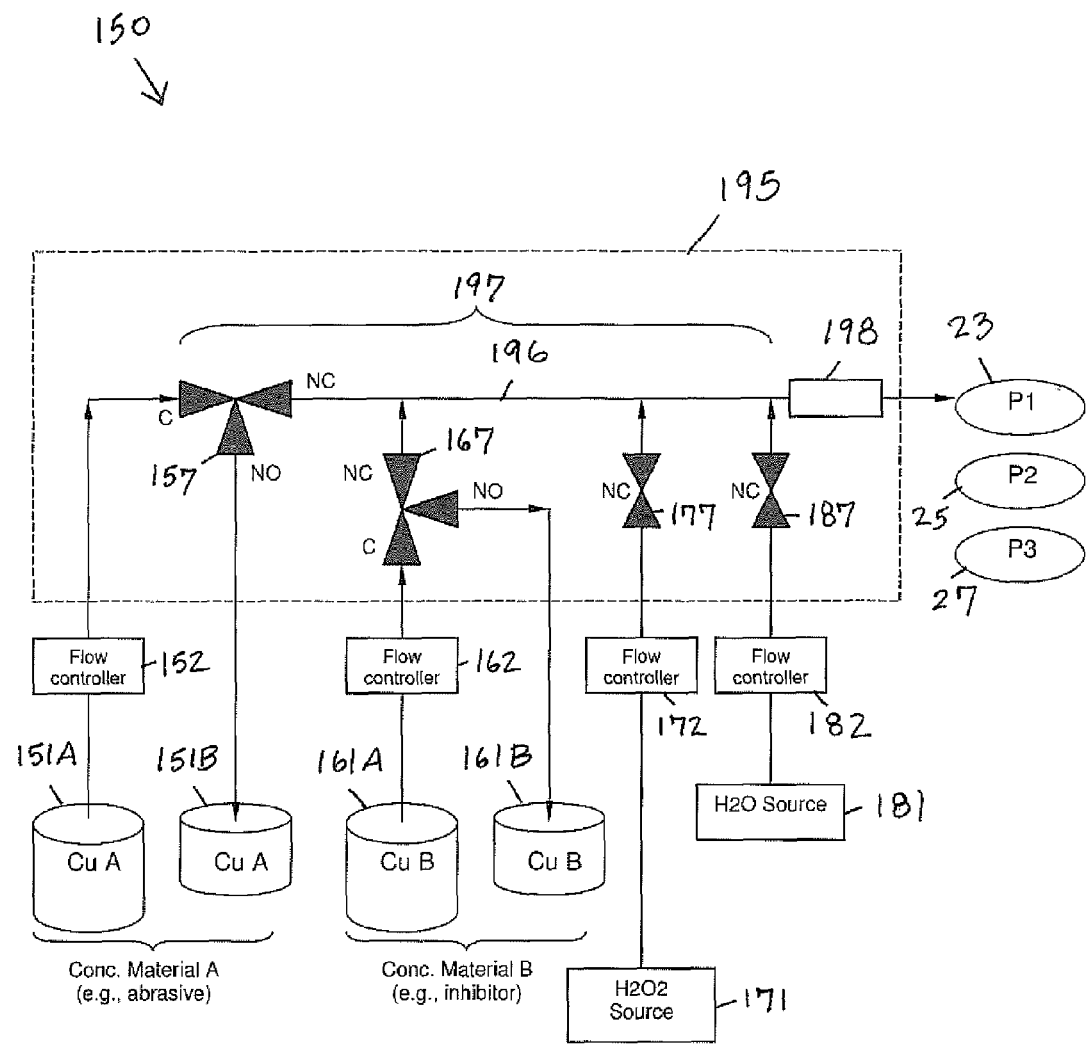
FIG._4

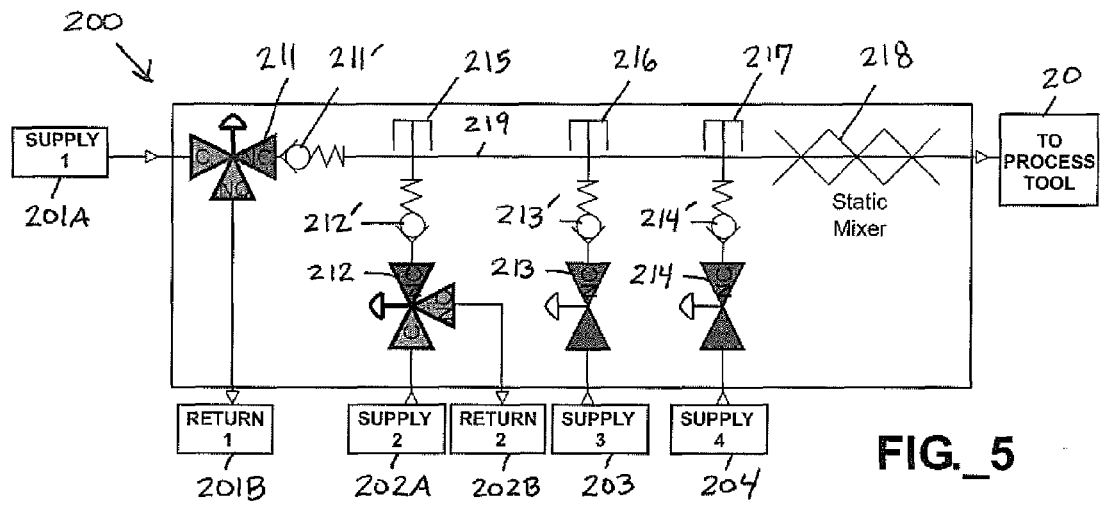
FIG._5
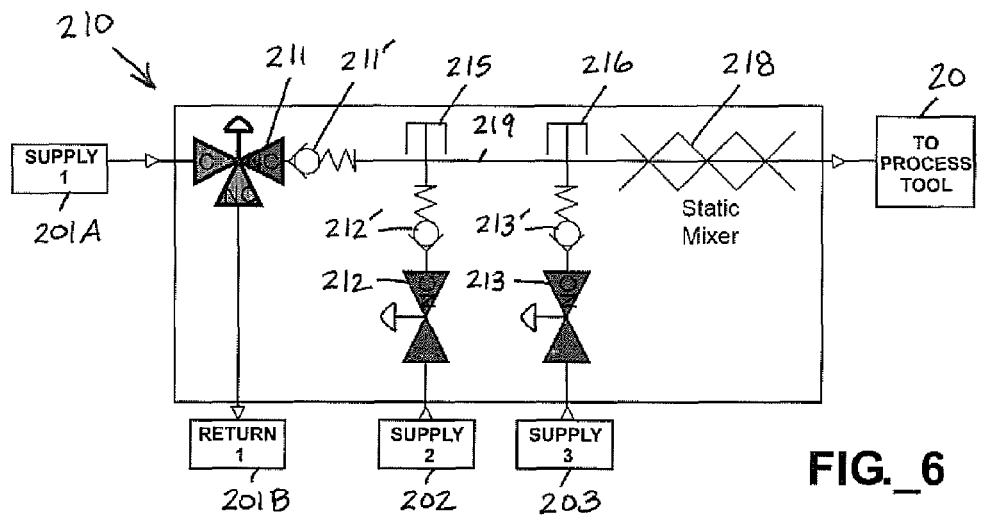
FIG._6
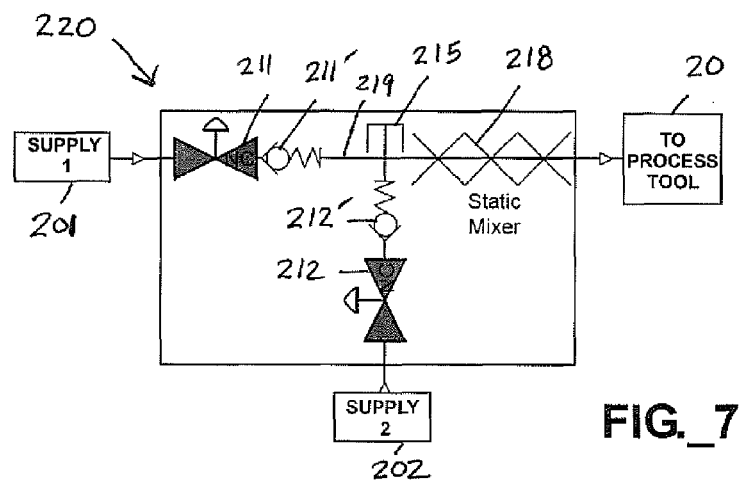
FIG._7

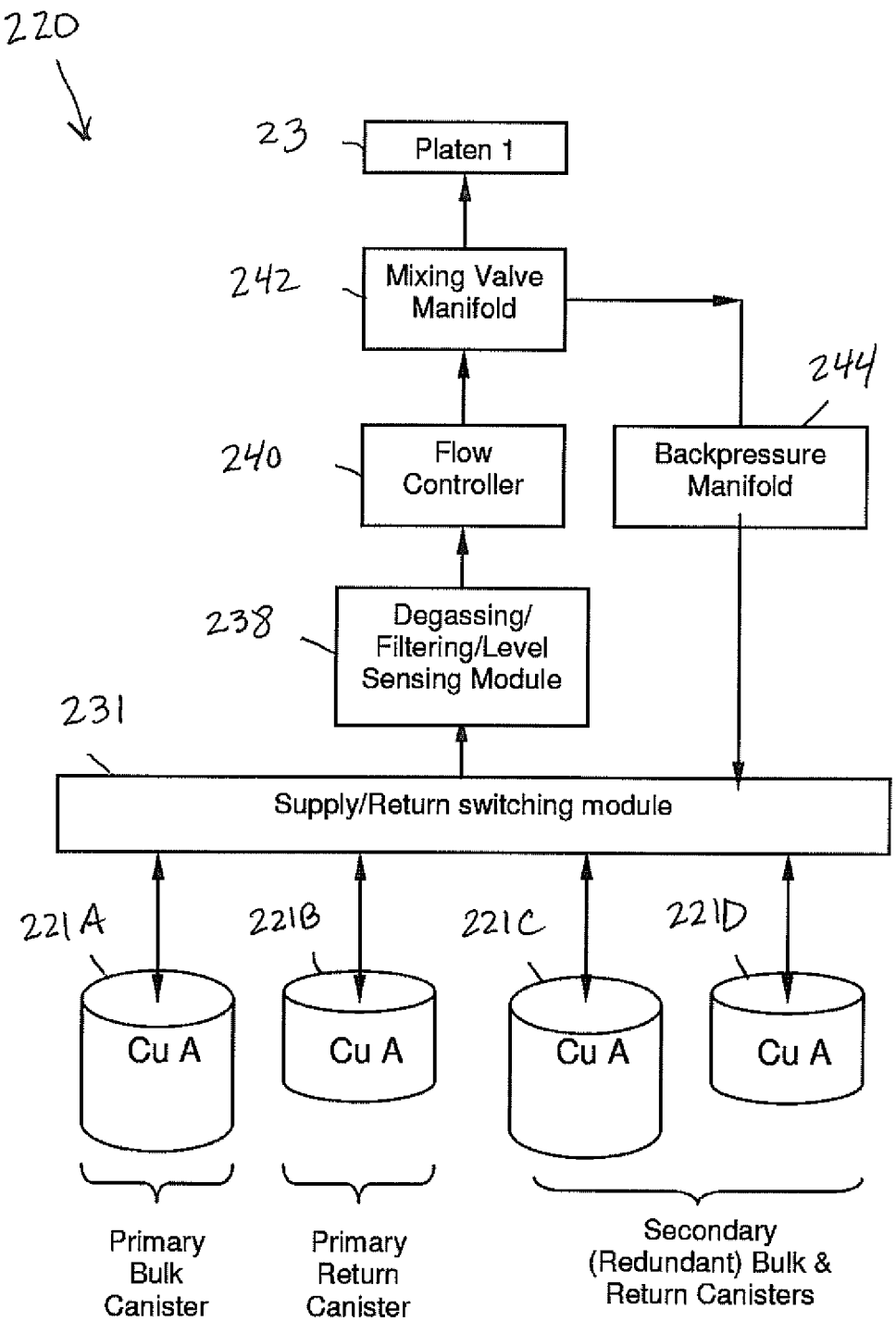
FIG._8

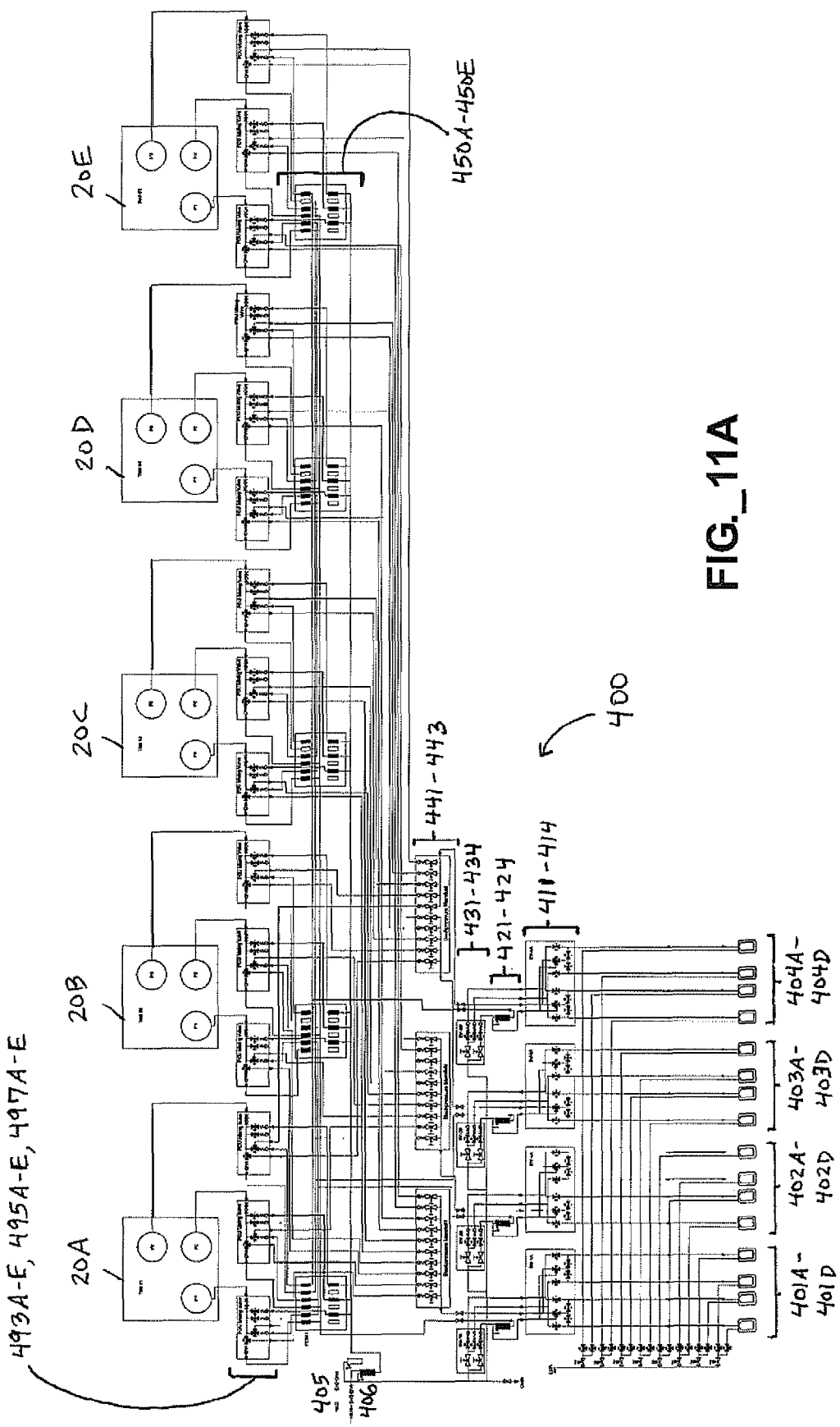
FIG._11A

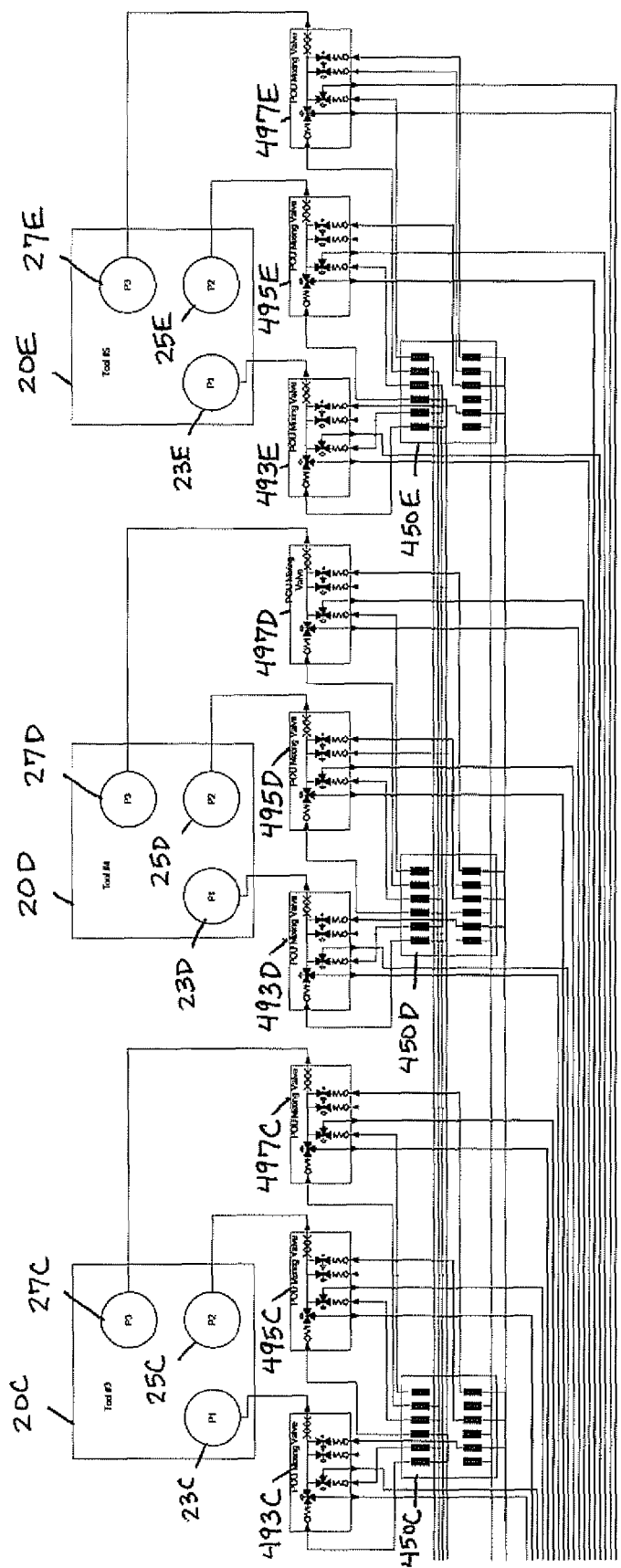
FIG._11C

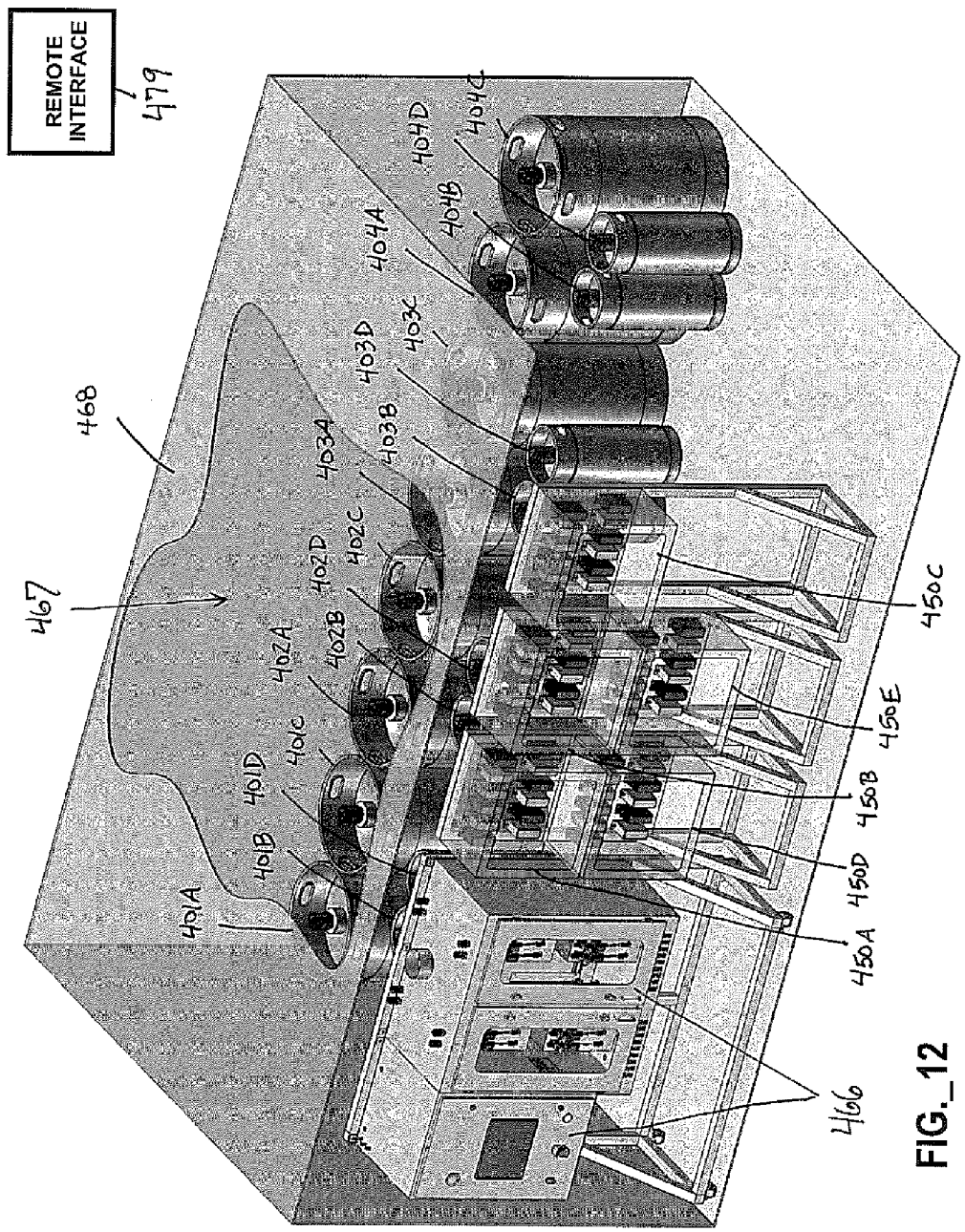
FIG._12

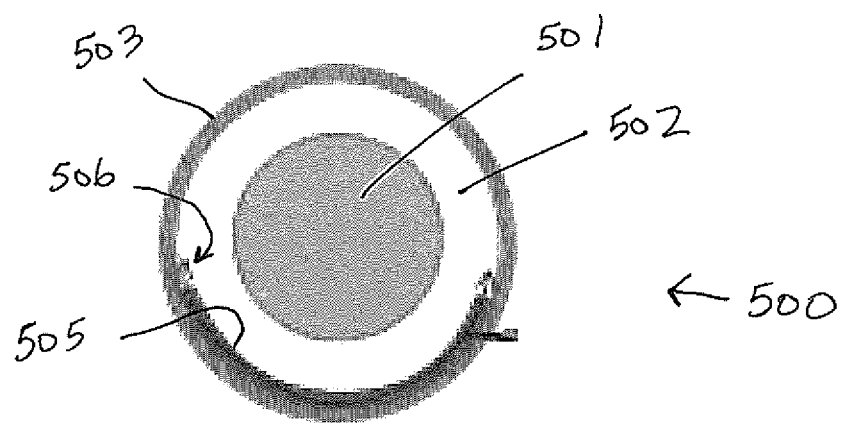
FIG._13A
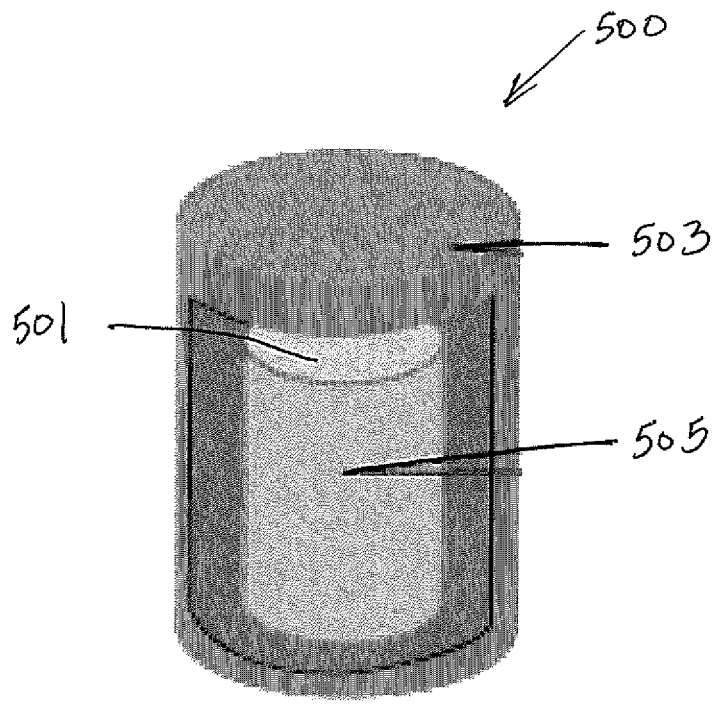
FIG._13B

| Station | Conventional Process | CMPlicity Hybrid Process |
|---|---|---|
| P1 | P1 pre-blended CMP composition | P1 Early Process:<br>- Produce and deliver VUL for 35s (e.g., VUL at 10,000 A / min for 35 s, versus VAZ ~ 6,000 A / min for 60 s)<br><br>• 5 pts V1-UL 3.6X + 10 pts DIW + 3 pts $H_2O_2$ yields VUL<br>• Flow rates: 83 ml/min + 167 ml/min + 50 ml/min<br>• Total flow rate: 300 ml/min<br><br>- Process characteristics: fast, high planarization efficiency<br><br>P1 Late process:<br>- Produce and deliver VAZ for < 25s<br><br>• 5 pts V1-UL 3.6X + 10 pts DIW + 3 pts $H_2O_2$ + 2 pts AZ 10X yields ~VAZ undiluted<br>• Flow rates: 83 ml/min + 167 ml/min + 50 ml/min + 33 ml/min<br>• Total flow rate: 333 ml/min<br><br>- Process characteristics: slow, low defectivity, low dishing rate |
| P2 | P2 pre-blended CMP composition | P2 Process:<br>- Produce and deliver VAZ for up to 60s<br>- Follows the late P1 process |
| P3 | P3 Barrier composition | P3 Process:<br>- No change<br>- Lower buff requirement due to improved P1 and P2 processes |

FIG._14

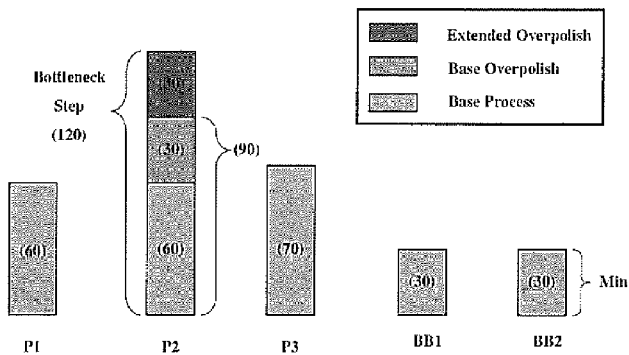

FIG._15

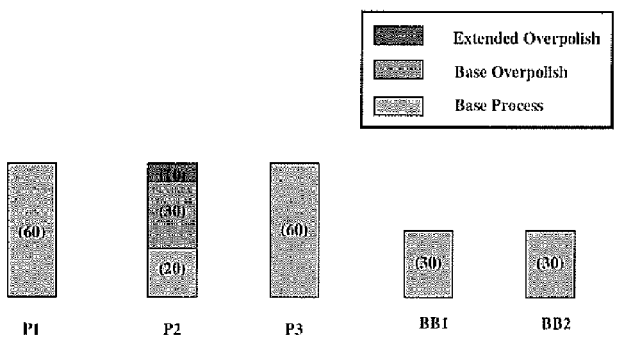

FIG._16

| Process Comments | Platen 1 | | | Platen 2 (VAZ) | | | Dishing (Å) | | |
|---|---|---|---|---|---|---|---|---|---|
| | VUL time (s) | VAZ time (s) | Total time (s) | EP time (s) | Overpolish time (s) | Total time (s) | Center | Donut | Edge |
| Mixed P1 process to increase tool throughput, long P1 time | 30 | 30 | 60 | 37 | 20 | 57 | 279 | 290 | 470 |
| As above, but shorter P1 time and longer OP time | 30 | 25 | 55 | 64 | 30 | 94 | 648 | 528 | 953 |
| Comparing mixed and regular P1 processes to each other | 30 | 25 | 55 | 63 | 20 | 83 | 421 | 377 | 662 |
| | 0 | 55 | 55 | 118 | 20 | 138 | 213 | 544 | 799 |
| As above, but longer P1 times | 0 | 60 | 60 | 114 | 20 | 134 | 316 | 415 | 842 |
| | 30 | 30 | 60 | 59 | 20 | 79 | 480 | 296 | 773 |
| Repeat of row above | 30 | 30 | 60 | 60 | 20 | 80 | 351 | 433 | 737 |
| Comparing mixed and regular P1 processes, longer P1 times | 30 | 35 | 65 | 44 | 20 | 64 | 187 | 206 | 593 |
| | 0 | 65 | 65 | 94 | 20 | 114 | 225 | 260 | 905 |

FIG._17

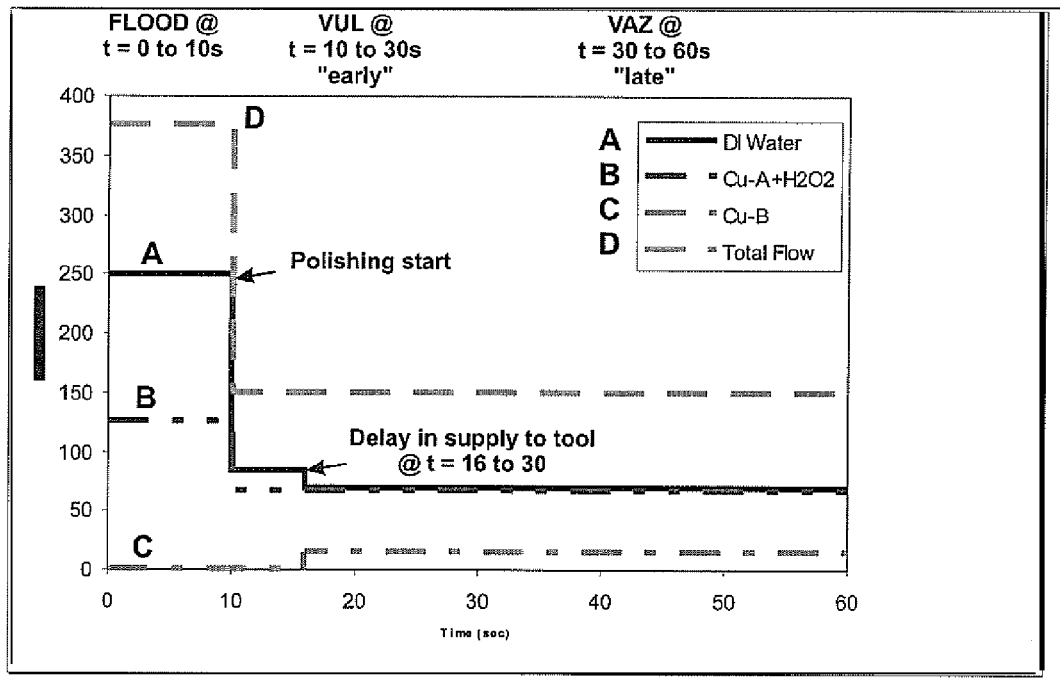
FIG._18A
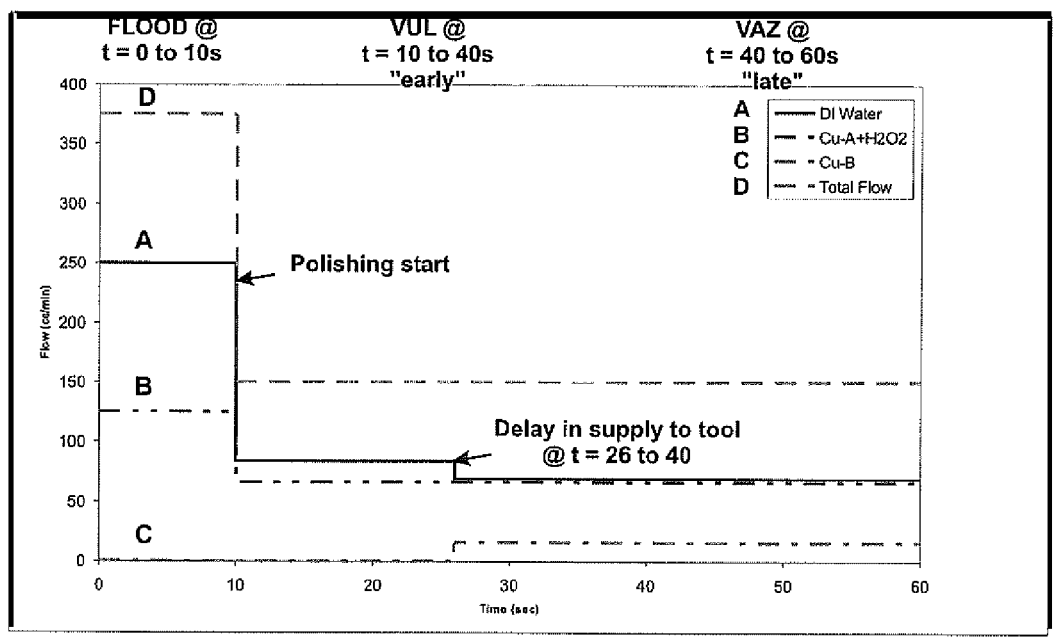
FIG._18B

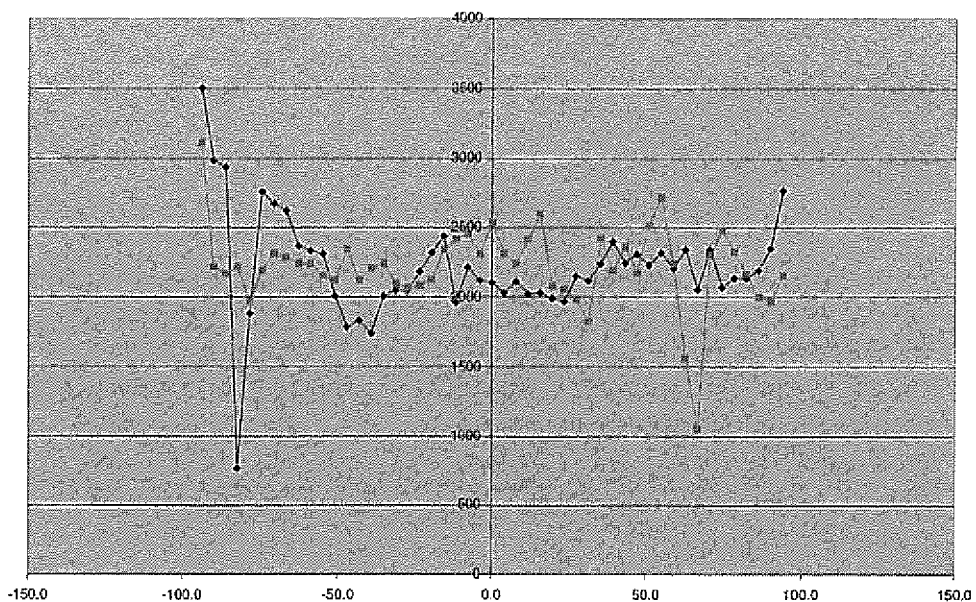
FIG._19A
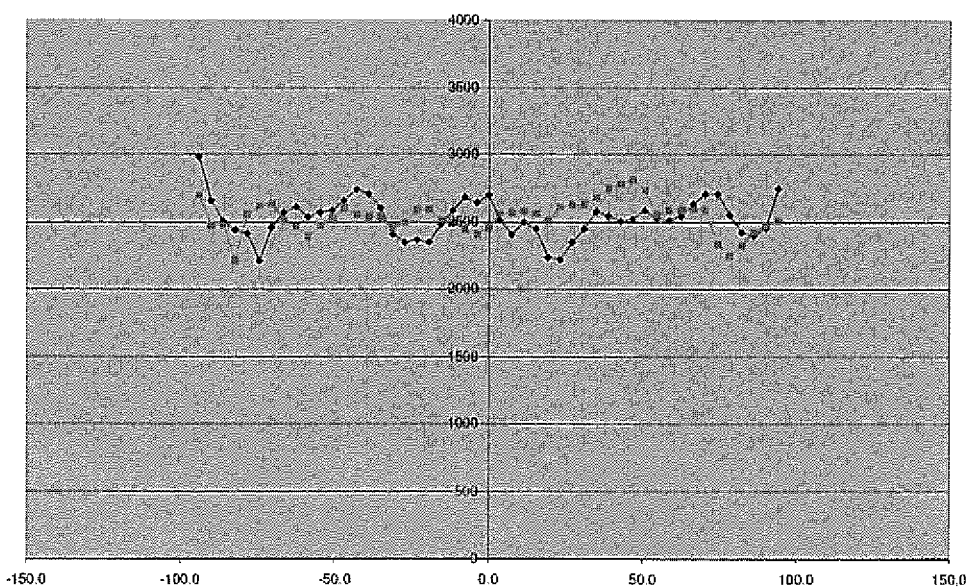
FIG._19B

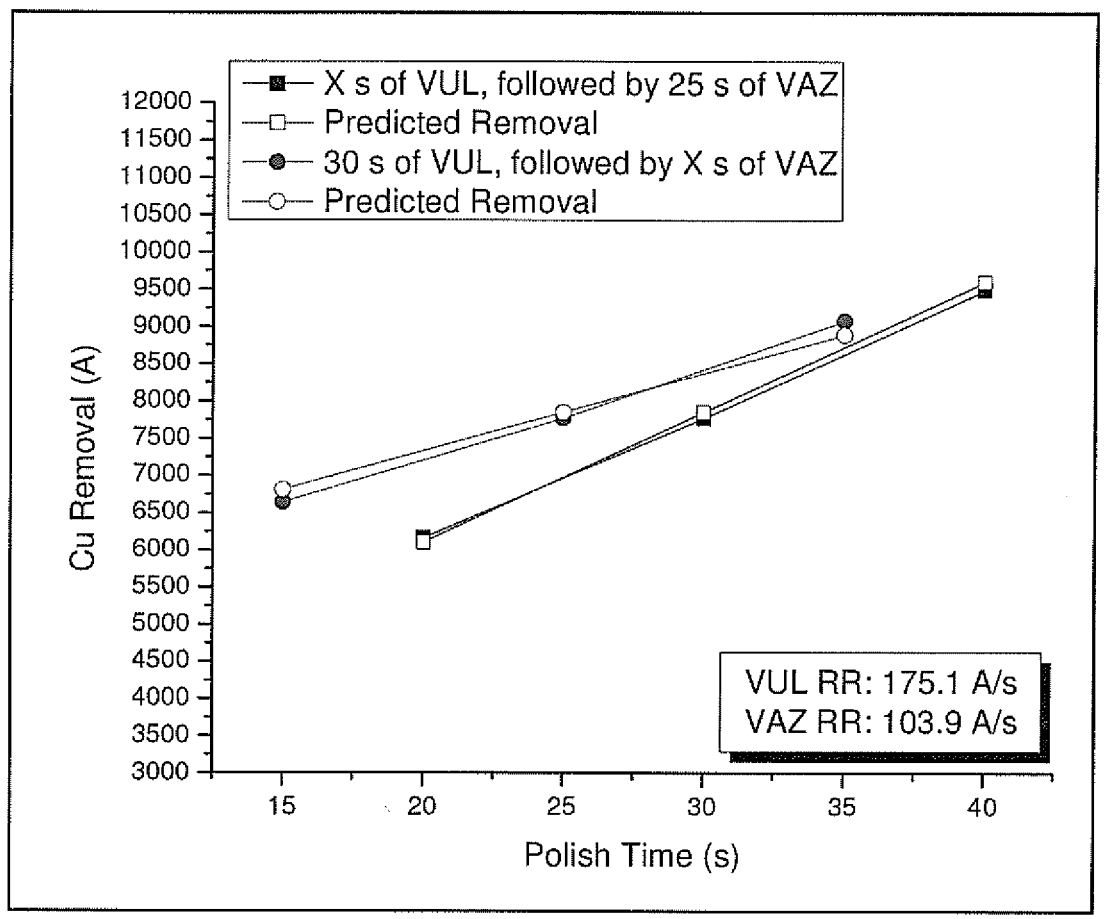
FIG._20

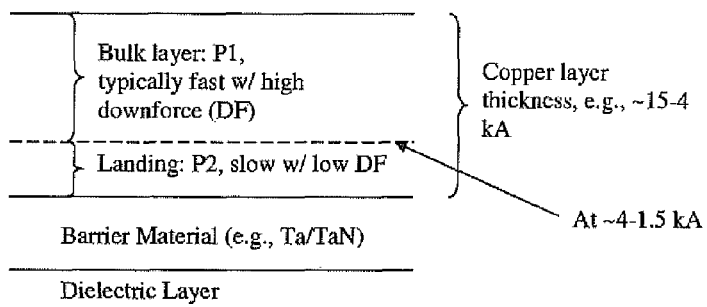
FIG._21A
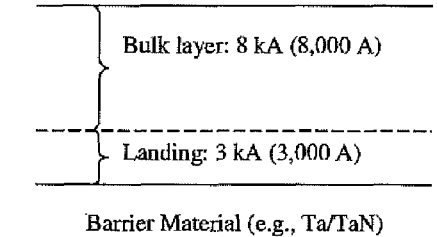
FIG._21B
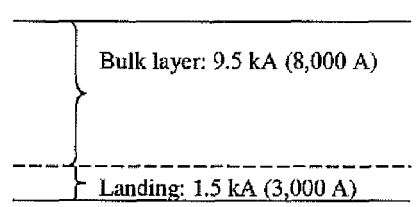
FIG._21C
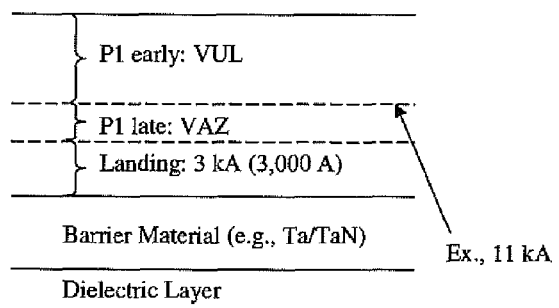
FIG._21D
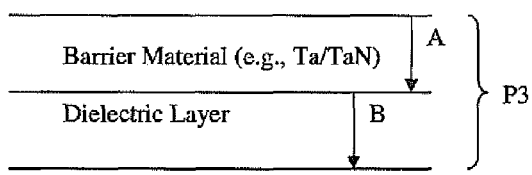
FIG._21E

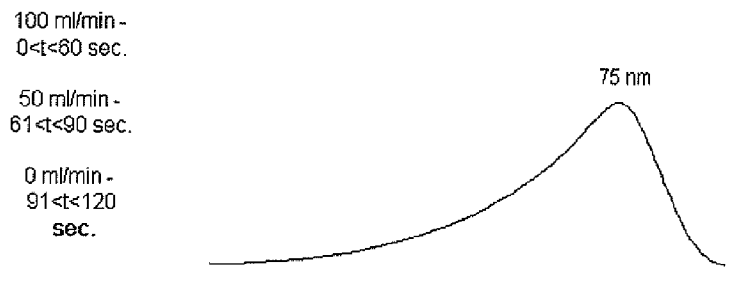
FIG._22A
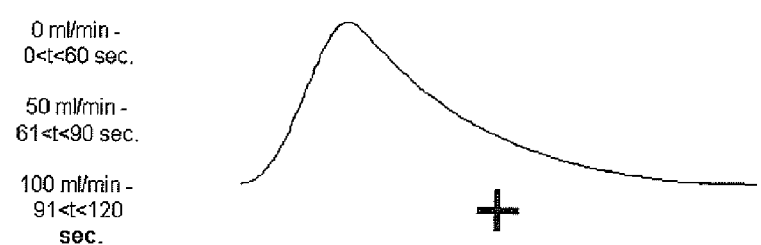
FIG._22B
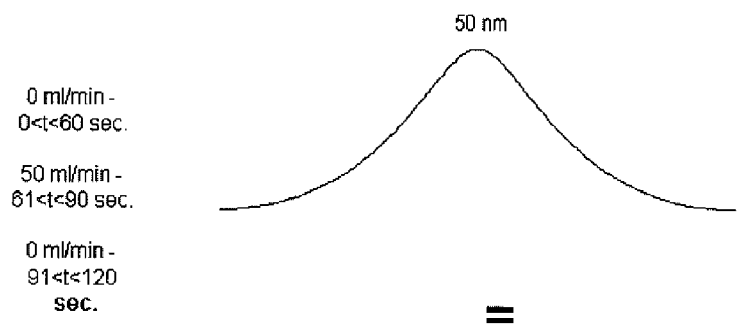
FIG._22C
FIG._22D

|  | Standard VAZ, undil |
| --- | --- |
|  | Concentration (wt.%) |
| DI Water | remainder |
| Chelator | 3.0 |
| Inhibitor | 0.4 |
| Pol 2 / PVP | 0.2 |
| Abrasive | 1.0 |
| Pol 1 / SEA | 0.1 |
| H2O2 | 5.0 |

FIG. 23A

|  | VAZ-X, 4.3 dil, 4% H2O2 | VAZ-D, 4.33 dil @ 2.8% H2O2 | VAZ-C @ 2.3% H2O2 |
| --- | --- | --- | --- |
|  | Concentrations (wt.%) | Concentrations (wt.%) | Concentrations (wt.%) |
| DI Water | remainder | remainder | remainder |
| Chelator | 0.70 | 0.74 | 2 |
| Inhibitor | 0.09 | 0.11 | 0.5 |
| Pol 2 / PVP | 0.05 | 0.01 | 0.15 |
| Abrasive | 0.23 | 0.28 | 0.5 |
| Pol 1 / SEA | 0.05 | 0.028 | 0.02 |
| H2O2 | 3.96 | 2.8 | 2.3 |

SYSTEMS AND METHODS FOR DELIVERY OF FLUID-CONTAINING PROCESS MATERIAL COMBINATIONS

STATEMENT OF RELATED APPLICATION(S)

This application is a U.S. national phase application under the provisions of 35 U.S.C. §371 of International Application No. PCT/US08/85826 filed on Dec. 8, 2008, which in turn claims priority to U.S. Patent Application No. 60/992,988 filed on Dec. 6, 2007 and entitled SYSTEMS AND METHODS FOR DELIVERY OF FLUID-CONTAINING PROCESS MATERIAL COMBINATIONS. The entire disclosures of such international application and U.S. priority application are hereby incorporated by reference as if set forth fully herein.

FIELD OF THE INVENTION

The present invention relates to systems and methods for delivery of fluid-containing process materials to fluid-utilizing processes, including processes employed in semiconductor fabrication.

DESCRIPTION OF THE RELATED ART

Delivery of fluid-containing process materials to process equipment (e.g., process tools) is routinely performed in a variety of manufacturing processes. Numerous industries require that feed materials be provided in ultra-pure form and substantially free of contaminants. The term "feed material" in this context refers broadly to any of various materials used or consumed in manufacturing and/or industrial processes.

In the context of manufacturing semiconductors and microelectronic devices, the presence of even small amounts of certain contaminants can render a resulting product deficient, or even useless, for its intended purpose. Accordingly, delivery systems (e.g., including containers and delivery components) used to supply feed materials to such manufacturing equipment must be of a character that avoids contamination issues. Material delivery containers must be rigorously clean in condition, while avoiding particle shedding, outgassing, and any other form of imparting contaminants from the containers and delivery components to feed materials contained within or otherwise disposed in contact therewith. Material delivery systems should desirably maintain feed material in a pure state, without degradation or decomposition of the contained material, given that exposure of feed materials to ultraviolet light, heat, environmental gases, process gases, debris, and impurities may impact such materials adversely. Certain feed materials may interact with one another in undesirable ways (e.g., chemical reaction or precipitation), such that combined storage of such constituents should be avoided. As pure feed materials can be quite expensive, waste of such materials should be minimized. Exposure to toxic and/or hazardous feed materials should also be avoided.

Chemical mechanical polishing (CMP) or planarization is a process in which material is removed from a surface of a semiconductor wafer and/or wafer product, and the surface is polished (planarized) by coupling a physical process such as abrasion with a chemical process such as dissolution, oxidation or chelation. In its most rudimentary form, CMP involves applying slurry, specifically a solution of an abrasive and one or more active chemistries, to a wafer surface or polishing pad that polishes the different materials on the surface structure of the semiconductor wafer to achieve both the removal of unwanted material and planarization of the wafer surface.

In a typical CMP process, various feedstock materials are blended to form a CMP suspension that is delivered to a planarization machine for application to a work surface. One feed material for a CMP process may include a silica-based abrasive, and another feed material may include a reactive agent (e.g., hydrogen peroxide). Various particulate materials and agents may be used in combinations and proportions that vary among different processing operations.

One problem with CMP suspensions, however, is that the particulate material often will not remain in a uniform, homogeneous suspension for a prolonged period of time. Some form of agitation, stifling, or mixing—for example, in a holding tank—is typically employed just prior to use to ensure that the particulate remains in suspension. The suspension (e.g., based on particle distribution and solids percent) can be maintained by keeping the fluid in constant motion; however, care must be given to avoid subjecting the entrained particles to excessive shear forces, which can lead to undesirable agglomeration. CMP suspensions are both abrasive and reactive, such that pumps or agitators dedicated to moving such fluids are subject to excessive wear, leading to substantially reduced efficiency or even premature failure.

A CMP tool generally includes multiple processing stations, with each station adapted to perform a sequential processing step. FIG. 1A illustrates a first CMP tool 10 having a central wafer handler 11 used to sequentially transport wafers through three stations 12, 14, 16 each having a platen 13, 15, 17 on which a wafer is processed. The CMP tool 10 is designed for sequential wafer processing: for example, to subject a first wafer to a first processing step at the first station 12, while a second wafer undergoes a second processing step at the second station 14, while a third wafer undergoes a third processing step at the third station 16, while additional wafers may be loaded in a wafer staging zone 18. FIG. 1B illustrates a second CMP tool 20 similar to the first CMP tool (i.e., with a central wafer handler 21 and three stations 22, 24, 26 each having a platen 23, 25, 27, and a wafer loading/unloading zone 28), but further including a plurality of brushing and/or finishing stations 30 for further wafer processing (e.g., meg-assisted cleaning, brushed cleaning for particle and/or organic removal, and/or wafer drying), with the brushing and/or finishing stations 30 having associated wafer handlers 31, 32 adapted for wafer transport.

As illustrated in FIG. 1C, a typical semiconductor device production facility 40 includes multiple CMP tools 20A-20E operating in parallel. Such tools 20A-20E are typically located on a fabrication floor ("fab"), with feed material containers and delivery components located on a sub-adjacent level ("sub-fab"). A mechanical mixer 41 is used to maintain CMP slurry in a supply vessel 42 in a uniform state. The slurry is fed to a distribution tank 45, from which a slurry distribution pump 46 pumps the slurry through a global distribution loop 48 to one station (e.g., the first processing station or the second processing station) of each of the CMP tools 20A-20E. It is to be appreciated that each corresponding group of processing stations among the tools 20A-20E has a corresponding global supply loop (e.g., with a first processing station for each tool 20A-20E being connected to a first global supply loop to supply a first slurry or mixture thereto, with a second processing station for each tool 20A-20E being connected to a second global supply loop to supply a second slurry or mixture thereto, and so on), with components of only a single slurry distribution network being illustrated in FIG. 1C to promote understanding by the reader. Remote instrumentation 47 may be provided (e.g., in sensory communication with the distribution loop 48) to provide signals for controlling the pump 46 and/or other components. The distribution loop 48 preferably includes a return to the distribution tank 45, with a backpressure control valve 49 disposed therein to maintain adequate pressure in the global distribution loop 48. Unfortunately, use of a distribution loop to feed a common CMP slurry to multiple CMP tools tends to introduce variability between devices produced by such tools, attributable at least in part to differing CMP slurry supply pressure conditions, attributable to differing fluid flow path lengths from the distribution tank 45 through the global distribution loop 48 to each tool 20A-20E.

Sequential operations performed at different processing stations of a multi-station CMP tool may include, for example, bulk copper removal (e.g., at a first station), copper clearing (e.g., at a second station), and barrier removal (e.g., at a third station), followed by brushed cleaning steps at one or more brushed cleaning steps (e.g., at one or more brushed cleaning stations). Such operations may require different time periods to produce satisfactory results. Given the sequential nature of the operations, it would be desirable to reduce processing time for any "bottleneck" operation, such as by matching or nearly matching processing time at each sequential station of a given multi-station CMP tool so as to optimize production efficiency, without sacrificing production quality. It would also be desirable to permit CMP process tools to operate on a continuous or substantially continuous basis, without need for periodic interruption to replenish depleted feed material containers.

In order to reduce the amount of individual distribution systems, typically only one or two CMP slurries (i.e. CMP chemistries, chemical/particulate combinations, and/or particulate sizes), are provided to each CMP tool, thus limiting the number of slurries available to each station within a tool. In some cases, CMP slurries may differ for operations employed at different processing stations of a CMP tool. In such cases, it is typical that each type of station has a dedicated holding tank to maintain slurry in a desired condition by agitation or stirring, and a dedicated slurry distribution tank from which the slurry is distributed to stations of similar types among different CMP tools. As indicated previously, in a semiconductor device production facility employing several multi-station CMP tools, stations of similar types among different tools may be connected to one or more common feed material distribution tanks, thus reducing the need for a dedicated holding tank for each tool. Different CMP station types may have different slurry (or other feed material) distribution loops. Use of global slurry distribution loops for multiple CMP tools leads to some variability in slurry supply conditions to each tool, and constrains manufacturing process flexibility, because it does not enable (1) slurry supply conditions to be rapidly varied as a function of time, or (2) simultaneous use of different chemistries in different CMP tools and/or stations. Furthermore, to reduce cost of the installation and maintenance of multiple global distribution loops, typically only one or two slurry distribution loops are employed for a set of multiple CMP tools. An alternative configuration utilizes a dedicated slurry holding/agitation tank for each CMP tool, but such configuration entails high costs associated with purchasing and maintaining numerous tanks, and related agitation and delivery equipment.

An ideal feed material delivery system would enable different CMP chemistries, chemical/particulate combinations, and/or particulate sizes to be provided to different CMP tools and different CMP station types, at different times and/or in different combinations as a function of time, with no lag time, from a minimum number of feed material containers, and with minimal waste. The use of highly concentrated feed materials is also desired, as concentrated materials last longer and are more cost-efficient than pre-blended conventional formulations.

As will be appreciated by those skilled in the art, various combinations of the foregoing challenges associated with delivery of multi-constituent feed materials are also inherent to fluid-utilizing processes in contexts other than CMP, including, but not limited to, food and beverage processing, chemical production, pharmaceutical production, biomaterial production, and bioprocessing.

It would be desirable to mitigate the foregoing problems in supplying feed materials to fluid-utilizing processes employing fluid-containing, multi-constituent process materials.

SUMMARY OF THE INVENTION

Certain embodiments of the present invention avoid problems associated with supplying fluid-containing feed materials to multiple fluid-utilizing process tools and/or processing stations by using common sources of different process materials (with at least one source preferably being concentrated), using at least one dedicated blending manifold for each process tool and/or station, regulating supply of each process material to each blending manifold, and blending process materials in desired proportions in each blending manifold associated with a different process tool and/or processing station. A source of multi-constituent process material may include a first supply container and a first return container, and a circulation apparatus is provided to circulate at least a portion of the first material between the supply and return container. Such containers may include liner-based containers adapted for non-gas contacting, pressure dispensation, such as various containers (e.g., NOWPAK™ containers) commercially available from Advanced Technology Materials, Inc. (Danbury, Conn., USA).

In one aspect, the present invention relates to a process material delivery system comprising: a plurality of first containers adapted to contain a first process material comprising at least one fluid; a first circulation apparatus adapted to circulate at least a portion of said first process material through at least one first circulation flow path between said plurality of first containers; at least one blending manifold in at least intermittent fluid communication with the first circulation apparatus and a source of second process material; and at least one flow control element adapted to regulate delivery of any of (i) the first process material to the at least one blending manifold, and (ii) the second process material to the at least one blending manifold.

In another separate aspect, the invention relates to a method for delivering process materials to at least one point of use, the method comprising: circulating a first process material comprising at least one fluid in at least one first circulation flow path between at least two containers of a plurality of first containers; regulating supply of at least one of said first process material and a second process material to at least one blending manifold with at least one flow control element; blending said first process material and said second process material in the at least one blending manifold; and dispensing a desired material blend comprising said blended first process material and second process material to said at least one point of use. Preferably, the at least one first circulation flow path extends through the at least one blending manifold.

In another separate aspect, the invention relates to a system adapted for use with at least one manufacturing process tool having a plurality of independently controllable processing stations, the system comprising: a first interface to a common source of a first process material configured to provide said first process material for use by each of the first tool and the second tool; a second interface to a common source of a second process material configured to provide said second process material for use by each of the first tool and the second tool; a plurality of blending manifolds including a dedicated blending manifold for each processing station of the plurality of processing stations; and for each blending manifold of the plurality of blending manifolds, at least one flow control element adapted to regulate delivery to the blending manifold of any of the first process material and the second process material.

In another separate aspect, the invention relates to a method for processing a semiconductor device utilizing a processing station of a semiconductor device manufacturing process tool, the method comprising: independently regulating supply each of (i) a first process material from a common first process material source and (ii) a second process material from a common second process material source, to a first blending manifold in fluid communication with the processing station to generate a first blend of process materials; performing a first processing step on the semiconductor device at the processing station utilizing the first blend; independently regulating supply of each of (i) a third process material from a common third process material source and (ii) either (a) a fourth process material from a common fourth material source or (b) the first process material from the common first material source, to the first blending manifold in fluid communication with the processing station to generate a second blend of process materials; and performing a second processing step on the semiconductor device at the processing station utilizing the second blend, wherein the second processing step follows the first processing step without substantial interruption.

In another separate aspect, the invention relates to a method for processing a plurality of semiconductor devices utilizing a first and a second semiconductor device manufacturing process tool, with each semiconductor device manufacturing process tool having a plurality of semiconductor device processing stations, the method comprising: (A) independently regulating supply of each of (i) a first process material from a common first process material source and (ii) a second process material from a common second process material source, to a first blending manifold in fluid communication with a first selected discrete station of the plurality of semiconductor processing stations of the first semiconductor manufacturing tool to generate a first blend of said first process material and said second process material provided to the first selected discrete station; (B) independently regulating supply of each of (i) said first process material from said common first process material source and (ii) a second process material from said common second process material source, to a second blending manifold in fluid communication with a second selected discrete station of the plurality of semiconductor processing stations of the first semiconductor manufacturing tool to generate a second blend of said first process material and said second process material provided to the second selected discrete station; (C) changing said supply of any of said first process material and said second process material to said first blending manifold to alter composition of said first blend provided to the first selected discrete station during processing of a first semiconductor device therein; and (D) changing said supply of any of said first process material and said second process material to said second blending manifold to alter composition of said second blend provided to the second selected discrete station during processing of a second semiconductor device therein.

In another separate aspect, any of the foregoing aspects may be combined for additional advantage.

Other aspects, features and embodiments of the invention will be more fully apparent from the ensuing disclosure and appended claims.

BRIEF DESCRIPTION OF THE DRAWINGS

FIG. 1A is a schematic plan illustration of a first conventional multi-station planarization tool having multiple processing stations, with each station adapted to perform a sequential processing step on a wafer.

FIG. 1B is a schematic plan illustration of a second conventional multi-station planarization tool having multiple processing stations, similar to the tool of FIG. 1A, but with the addition of a plurality of brushing and/or finishing stations and related wafer handlers.

FIG. 3 is a schematic diagram illustrating connections between various components of at least a portion of a second process material delivery system according to an embodiment the present invention, the system including a blending manifold adapted to receive of the first process material and a second process material delivered through a first and a second flow controller, respectively.

FIG. 4 is a schematic interconnect diagram illustrating connections between various components of at least a portion of a third process material delivery system according to an embodiment the present invention, including a blending manifold configured to receive controlled delivery of process materials from a first and a second concentrated material source, and a third and a fourth additional material source, with the first and the second material source each having a supply container and return container.

FIG. 5 is a schematic interconnection diagram illustrating connections between various components of a first blending manifold useable with material delivery systems according to certain embodiments of the present invention.

FIG. 6 is a schematic interconnection diagram illustrating connections between various components of a second blending manifold useable with material delivery systems according to certain embodiments of the present invention.

FIG. 7 is a schematic interconnection diagram illustrating connections between various components of a third blending manifold useable with material delivery systems according to certain embodiments of the present invention.

FIG. 8 is a schematic interconnection diagram illustrating connections between various components of at least a portion of a fourth process material delivery system according to an embodiment the present invention, including primary supply and return containers, and redundant or backup supply and return containers, with a switching module preferably adapted to switch flow between any of (i) supply and return containers, and (ii) primary and secondary containers.

FIG. 11A is an interconnection diagram illustrating connections between various components of a system adapted to supply various combinations of (i) four different process materials supplied by pressure dispensing from redundant pairs of containers (preferably liner-based) containing the four materials (sixteen containers total) and (ii) two different line-fed process materials to five different planarization tools each having at least three wafer processing stations, the system including a blending manifold for each wafer processing station of each planarization tool.

FIG. 11C is an magnified (right) portion of the interconnection diagram of FIG. 11A.

FIG. 12 is a perspective view rendering of a portion of the system illustrated in FIG. 11A including the sixteen containers.

FIG. 13A is a top cross-sectional view of a drum including a compressible portion, disposed within a pressure cabinet, and useable with fluid supply systems according to various embodiments of the present invention.

FIG. 13B is a perspective view of the compressible drum-containing pressure cabinet of FIG. 13A.

FIG. 14 is a table disclosing parameters of a wafer processing method applied to a multi-station semiconductor planarization tool, with a blend of process material having composition that varies with respect to time being supplied to the first station P1.

FIG. 15 is a bar chart representing wafer processing time for various stations of a multi-station semiconductor planarization tool employing conventional systems and processing methods.

FIG. 16 is a bar chart representing improved wafer processing time for various stations of a multi-station semiconductor planarization tool employing at a first station thereof a process material with a time-varying composition or consecutively employing any number of process materials having different compositions, according to systems and methods according to various embodiments of the present invention.

FIG. 17 is a table providing test data, including processing time and dishing measurements, obtained for various test processes employed by first and second platens of a multi-station semiconductor planarization tool utilizing systems and methods according to embodiments of the present invention, as compared to conventional processes.

FIG. 18A is a superimposed line chart illustrating a first time-dependent blend composition profile, including flow as a function of time for various components of a blend of multiple process materials, supplied to a first station of a semiconductor planarization tool during wafer processing, useable with systems and methods according to embodiments of the present invention.

FIG. 18B is a superimposed line chart illustrating a second time-dependent blend composition profile, including flow as a function of time for various components of a blend of multiple process materials, supplied to a first station of a semiconductor planarization tool during wafer processing, useable with systems and methods according to embodiments of the present invention.

FIG. 19A includes superimposed plots of copper removal rate profiles (Angstroms/min) data as a function of wafer position obtained for two wafers polished with a premixed composition denoted VAZ supplied from a reservoir.

FIG. 19B includes superimposed plots of copper removal rate profiles (Angstroms/min) data as a function of wafer position obtained for two wafers polished with composition denoted VAZ blended at or near the point of use using concentrated process material constituents.

FIG. 20 is a line chart depicting predicted and actual copper removal (Angstroms) as a function of polish time (seconds) for polishing wafers in a first station of a planarization tool with a composition denoted as "VUL" in a first process segment followed without interruption by polishing with a composition denoted as "VAZ" in a second process segment.

FIG. 21A is a schematic cross-sectional view of various exemplary layers deposited over a microelectronic device substrate, prior to application of a chemical mechanical planarization process thereto, showing typical thickness ranges (in kiloAngstroms) for the bulk and landing layers.

FIG. 21B is a schematic cross-sectional view of a first example of various layers deposited over a microelectronic device substrate, including specific bulk and landing layer thicknesses, prior to application of a chemical mechanical planarization process thereto.

FIG. 21C is a schematic cross-sectional view of a second example of various layers deposited over a microelectronic device substrate, including specific bulk and landing layer thicknesses, prior to application of a chemical mechanical planarization process thereto.

FIG. 21D is a schematic cross-sectional view of a third example of various layers deposited over a microelectronic device substrate, showing a first portions of a bulk layer to be removed by a "P1 early" process segment, and a second portion of the bulk layer to be removed by a "P1 late" process segment.

FIG. 21E is a schematic cross-sectional view of a barrier layer deposited over a dielectric layer on microelectronic device substrate, as processible with platen P3 of a multi-station CMP tool.

FIG. 22A includes flow parameters as a function of time for time periods within 0 to 120 seconds (at left) for producing a blended process material including a first process material precursor having the illustrated particle size distribution profile (at right), with the first process material precursor having a discernable particle size distribution peak at 75 nanometers.

FIG. 22B includes flow parameters as a function of time for time periods within 0 to 120 seconds (at left) for producing a blended process material including a second process material precursor having the illustrated particle size distribution profile (at right), with the second process material precursor having a discernable particle size distribution peak at 25 nanometers.

FIG. 22C includes flow parameters as a function of time for time periods within 0 to 120 seconds (at left) for producing a blended process material including a third process material precursor having the illustrated particle size distribution profile (at right), with the third process material precursor having a discernable particle size distribution peak at 50 nanometers.

FIG. 22D includes precursor flow parameters as a function of time for time periods within 61 to 90 (at left) for first, second, and third process material precursors having the particle size distribution profiles illustrated in FIGS. 22A-22C combined to yield a time-dependent process material blend, with superimposed first, second, and third overlapping particle size distribution profiles (at right).

FIG. 23A provides a table of compositional information for a first undiluted multi-constituent process material denominated as "Standard VAZ" useable with systems and methods according to various embodiments of the present invention directed to semiconductor device planarization.

FIG. 23B provides a table of compositional information for second, third, and fourth diluted multi-constituent planarization process materials denominated as "VAZ-X," "VAZ-D," and "VAZ-C" useable with systems and methods according to various embodiments of the present invention directed to semiconductor device planarization.

DETAILED DESCRIPTION OF THE INVENTION, AND PREFERRED EMBODIMENTS THEREOF

Figure 1C:
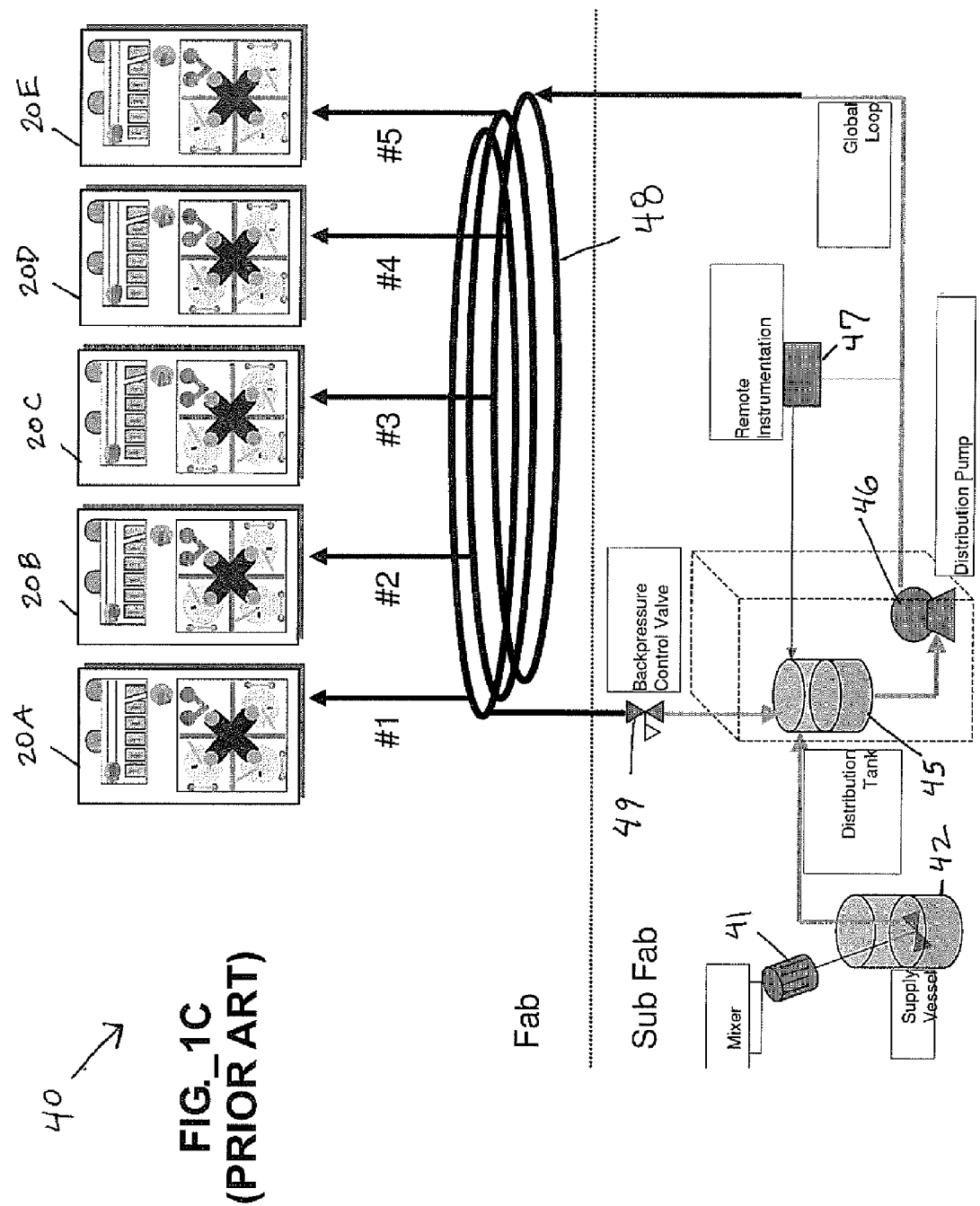
FIG. 1C is a schematic diagram illustrating connections between various components of a conventional process material delivery system configured to maintain a first slurry in a desired state via mechanical mixing or agitation, and to deliver the first slurry to one processing station each of a group of planarization tools via a global distribution loop.

The disclosures of the following patent documents are hereby incorporated herein by reference in their respective entireties:

U.S. Patent Application No. 60/916,966 entitled "SYSTEMS AND METHODS FOR MATERIAL BLENDING AND DISTRIBUTION" filed on May 9, 2007;

International Patent Application No. PCT/US08/63276 entitled "SYSTEMS AND METHODS FOR MATERIAL BLENDING AND DISTRIBUTION," filed on May 9, 2008 and published on Nov. 20, 2008 as International Patent Application Publication No. WO 2008/141206;

U.S. Pat. No. 6,698,619 entitled "RETURNABLE AND REUSABLE, BAG-IN-DRUM FLUID STORAGE AND DISPENSING CONTAINER SYSTEM;"

U.S. Pat. No. 7,188,644 entitled "APPARATUS AND METHOD FOR MINIMIZING THE GENERATION OF PARTICLES IN ULTRAPURE LIQUIDS;

U.S. Pat. No. 6,395,194 entitled "CHEMICAL MECHANICAL POLISHING COMPOSITIONS, AND PROCESS FOR THE CMP REMOVAL OF IRIDIUM THIN USING SAME;"

U.S. Pat. No. 6,579,798 entitled "PROCESSES FOR CHEMICAL-MECHANICAL POLISHING OF A SEMICONDUCTOR WAFER;"

U.S. Pat. No. 6,699,402 entitled "CHEMICAL MECHANICAL POLISHING COMPOSITIONS FOR CMP REMOVAL OF IRIDIUM THIN FILMS;"

U.S. Patent Application No. 60/887,435 filed on Jan. 31, 2007;

International Patent Application No. PCT/US2008/052614 entitled "STABILIZATION OF POLYMER-SILICA DISPERSIONS FOR CHEMICAL MECHANICAL POLISHING SLURRY APPLICATIONS," filed on Jan. 31, 2008 and published on Aug. 7, 2008 as International Patent Application Publication No. WO 2008/095078; and International Patent Application No. PCT/US2006/02203 entitled "INTEGRATED CHEMICAL MECHANICAL POLISHING COMPOSITION AND PROCESS FOR SINGLE PLATEN PROCESSING," filed on Jun. 6, 2006 and published on Dec. 14, 2006 as International Patent Application Publication No. WO/2006/133249.

The present invention relates in certain embodiments to systems and methods for supplying fluid-containing feed (process) materials to multiple fluid-utilizing process tools and/or processing stations by using common sources of different process materials (at least one source preferably being concentrated), using at least one dedicated blending manifold for each process tool and/or station, regulating supply of each process material to each blending manifold, and blending process materials in desired proportions in each blending manifold associated with a different process tool and/or processing station. One or more multi-constituent process materials may be circulated, preferably through at least one blending manifold, to minimize constituent separation and/or stratification. Constituents disposed within a single process material container should be compatible with one another, without causing substantial chemical reaction, precipitation, or degradation. Although it is contemplated that different (e.g., concentrated) process materials as described herein will have different compositions, common constituents may be present in multi-constituent process materials supplied by different process material sources, if compatible with the desired end use application. In one embodiment, at least one process material includes a plurality of compositionally different constituents.

Systems and methods according to embodiments of the present invention provide numerous benefits, including:

reducing variability in supply of process materials to multiple fluid-utilizing process tool stations operating in parallel;

enabling process material composition to be varied as a function of time during a continuous material (e.g., semiconductor device) processing step;

enabling optimization of sequential multi-step processing operations, whether from platen to platen and/or from layer to layer, to maximize throughput;

enabling use of any number of highly concentrated materials to be blended (e.g., with one another and/or other constituents) at the point of use; and eliminating the need for various process material mixing components.

Figure 2:
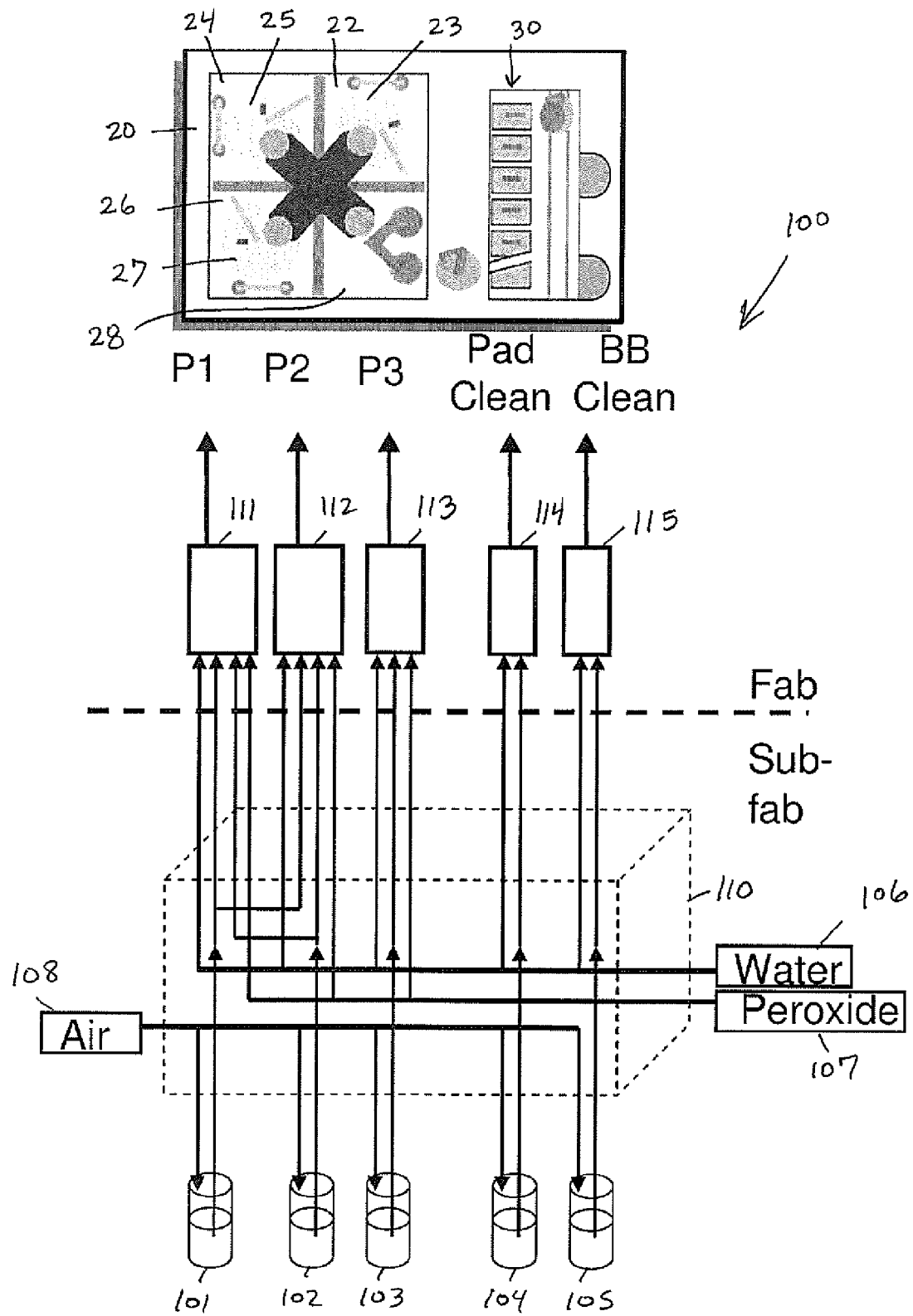
FIG. 2 is a schematic diagram illustrating connections between various components of at least a portion of a first process material delivery system according an embodiment of the present invention, the system being adapted to supply various blends of materials from a common set of process material sources to various processing stations of a multi-station planarization tool, with some of the sources being configured for pressure dispensation without circulation of process materials through a pump.

FIG. 2 is a schematic diagram illustrating connections between various components of at least a portion of a process material delivery system 100 according an embodiment of the present invention, adapted to supply different process material blends to a semiconductor planarization tool 20 and comprising a plurality of processing stations 22, 24, 26, 28, 30 (as described hereinabove in connection with FIG. 1B), with at least certain stations 22, 24, 26 including processing platens 23, 25, 27. Common containers 101-105 of first through fifth process materials, along with further supplies 106, 107 of (e.g., line-supplied) process materials such as water and hydrogen peroxide, are provided. The common containers 101-105 preferably each include a collapsible liner disposed within an overpack to define an interstitial space subject to controlled pressurization with a fluid source 108 to compress the liner and therefore dispense process material therefrom. Such pressure dispensation may eliminate the need for movement of process materials via pumps. In alternative embodiments, various types of containers and pressurization and/or pumping means may be employed.

The process material delivery system 100 preferably includes a dedicated material blending manifold 111, 112, 113, 114, 115 for each processing station 22, 24, 26, 28, 30, configured to blend various process materials (e.g., from common containers 101-105 or supplies 106, 107) in desired proportions. Such blending is preferably performed at or near the ultimate point of use. For process material combinations that may be reactive or otherwise incompatible when combined, maintaining such process materials as distinct from one another to be blended (in desired proportions) just prior to the point of use avoids such problems. As shown, each blending manifold 111-115 may be disposed at a "fab" level of a semiconductor processing facility, typically located one floor above associated material supply containers 101-105 (e.g., disposed at a "sub-fab" level). The containers 101-105 and any other desired components (e.g., filters, degassers, flow control elements, etc.) of the material delivery system 100 may be disposed within a suitable enclosure 110.

The term "blending manifold" as used herein should be construed to include any of various structures arranged to receive multiple flows of material and permit such material(s) to contact one another. In one embodiment, a blending manifold includes a pipe or conduit-defining structure having multiple fluidic connections. In another embodiment, a blending manifold comprises one or more pipe or conduit fittings (e.g., tees, elbows, etc.) that are arranged to permit various material flows to contact one another. A blending manifold is preferably formed of materials that are non-reactive with the materials to be contained (e.g., flowed) therein. In one embodiment, a blending manifold comprises a fluoropolymer structure (such as a block of polytetrafluoroethylene (PTFE)) in which various channels are defined through conventional techniques such as machining or drilling. A blending manifold may further include any of various flow control devices such as valves, such as may be subject to manual or automatic actuation. Any of various types of sensors such as described herein may be further added to or integrated with a manifold.

FIG. 2 is provided in simplified form to promote clarity in understanding the invention. Numerous components are desirably added to enhance operation and control of a commercial system, as will be appreciated by one skilled in the art and as further detailed hereinafter.

In one embodiment, a fluid-containing, multi-constituent feed material is maintained in a substantially uniform state prior to dispensation to a blending manifold and thereafter to a point of use, such as in a process tool or for dispensation to one or more containers for material storage and/or transport. In one embodiment, a circulation apparatus may include a reversible-flow circulation apparatus with a flow path that includes the collapsible liner of a first container and the collapsible liner of a second container. The process of circulating fluid between containers helps maintain the fluid is a substantially uniform state. Process material requiring circulation is preferably circulated from one container to another at least once prior to dispensing to a point of use. A preferred circulation apparatus includes components adapted to permit pressure dispensing the contents of one container to another container, and vice-versa. Alternatively, or additionally, a circulation apparatus may include any desired material circulation components (including pumps, positive displacement pumps, peristaltic pumps, piston- or spring-driven devices, and the like), as will be recognized by one skilled in the art.

FIG. 3 illustrates at least a portion of a process material delivery system 50 adapted to circulate a first fluid-containing, multi-constituent feed material to maintain its homogeneity prior to controlled discharge of such material to a blending manifold 95 for ultimate dispensation to a process tool 99 (or, alternatively, to another point of use such as material storage and/or transport container(s), or a dispensing and/or packaging tool employed for dispensing and/or packaging blended materials in one or more suitable containers, such as storage containers). The system 50 includes a process material supply container 51 having a first housing 52 containing a first collapsible liner 54. A first sealable volume 53 is defined between the first housing 52 and the first collapsible liner 54. The first housing 52 is preferably more rigid than the first liner 54, so that pressurization of the first sealable volume 53 is effective to compress the first collapsible liner 54 and thereby discharge any feed material contained in the liner 54 from the supply container 51. A first cap 56 fitted to the supply container 51 includes a fluid flow passage (i.e., a fluid feed passage) permitting fluid communication between the interior 55 of the first collapsible liner 54 and a first discharge or return conduit 71. An optional first dip tube 57 may extend from the first cap 56 into the interior 55 of the first collapsible liner 54 to aid in dispensation. An optional first scale or other sensor 59 may be positioned to sense weight or another measurable parameter of the supply container 51 or its contents, whether before and/or during circulation and dispensation.

The system 50 further includes a return container 61 that may be similar or substantially identical in character to the supply container 51. Alternatively, the return container 61 may differ in volume, materials, dispensation type, or any other desired aspect relative to the supply container 51. The return container 61 includes a second housing 62 containing a second collapsible liner 64, with a second sealable volume 63 disposed therebetween. A second cap 66 is fitted to the return container 61, and includes a fluid flow passage permitting fluid communication between the interior 65 of the second collapsible liner 64 and a second discharge or return conduit 72. An optional second dip tube 67 may extend from the second cap 66 into the interior of the second collapsible liner 64 to aid in dispensation. An optional second scale or other sensor 69 may be further provided in sensory communication with the return container 61 or its contents.

Isolation valves 75, 76 are provided in discharge/return conduits 71, 72, respectively, for purposes including to permit new (e.g., material-containing) containers to be introduced to the system 50 upon depletion of the contents of at least one of the containers 51, 61. A circulation conduit 73 extends between the isolation valves 75, 76, and disposed along the circulation conduit 73 are an optional process material property sensor 77, optional process material flow sensor 78, and an outlet valve 79, providing any of intermittent, controlled, and selective fluid communication between the circulation conduit 73 and a downstream flow controller 60.

At least one pressure source 80 is provided in selective fluid communication with the first sealable volume 53 of the supply container 51, and with the second sealable volume 63 of the return container 30. Disposed between the at least one pressure source 80 and the containers 51, 61 are valves 83, 84. Valve 83 is selectively operable to open a flow path between the at least one pressure source 80 and the first sealable space 53 via conduits 81, 85, and further operable to release pressure from the first sealable space 53 to a vent 83'. Likewise, valve 84 is selectively operable to open a flow path between the at least one pressure source 80 and the second sealable space 63 via conduits 82, 86, and further operable to release pressure from the second sealable space 63 to a vent 84'. Each valve 83, 84 is preferably a three-way valve, or may be replaced with one or more two-way valves.

Prior to operation of the system 50, the circulation conduit 73 may be evacuated, such as by drawing suction on the outlet valve 79 or a vent valve (not shown) in fluid communication with the circulation conduit 73. The length and diameter of the circulation conduit 73 may be selected to provide a desired volume between the two containers 51, 61. One or more optional flow restriction elements or flow-through mixing elements (not shown), such as orifices or valves, may be disposed within the circulation conduit 73 to enhance mixing action as desired.

In operation of the system 50, a pressurized fluid (e.g., a gas such as air or nitrogen, or a liquid such as water, etc.) is supplied from the at least one pressure source 80 through conduit 81, valve 83, conduit 85, and cap 56 to pressurize (or modify the pressure of) the first sealable volume or space 53 and compress the first collapsible liner 54 to discharge a portion of a first feed material from the liner 54 through the first discharge conduit 71 and valve 75 into the circulation conduit 73. Although certain embodiments of the present invention include supplying pressurized fluid to compress a collapsible liner or inner housing and displace materials therefrom, other machines, devices or mechanisms for accomplishing the same result (e.g., piston and/or spring-driven mechanisms) can be used. During such operation, the outlet valve 79 is positioned to disallow fluid communication with the blending manifold 95 and process tool 99 (or other point of use). The second valve 76 may be open at such time to permit a flow of first feed material to enter the second collapsible liner 64 of the return container 61, with the valve 84 being opened to vent the second sealable space 63 as the collapsible liner 64 grows in volume. After a sufficient amount of first feed material has been introduced into the circulation conduit 73 (and optionally into the return container 61), pressurized fluid is supplied from the at least one pressure source 80 through conduit 82, valve 84, conduit 86, and second cap 66 to pressurize the second sealable space 63, thereby discharging first feed material from the second liner 64 through the second discharge conduit 72 and valve 76 into the circulation conduit 73.

The operational status of each container 51, 61 may be subject to change repeatedly over time, depending on direction of circulation of the first feed material. The names "supply container" and "return container" are used herein for ease of reference only, and are not intended to be limiting in this regard. One container 51, 61 may be initially filled with first feed material, while the other container 51, 61 may be initially empty. Either container or both containers 51, 61 may be removed from the system 50 when depleted, and replaced corresponding container(s), preferably replenished with first feed material.

The process of sequentially pressurizing the first sealable volume 53 and the second sealable volume 63 from the at least one pressure source 80 may be reversed and repeated as necessary to circulate first feed material initially contained in the supply container 51 to maintain same in a desirably uniform condition. Uniformity of the first feed material may be monitored with a sensor 77. Such sensor 77 may measure any desirable one or more characteristics of the feed material, such as a conductivity, concentration, pH, and composition. In one embodiment, the sensor 77 comprises an particle sensor, such as an optoelectrical particle size distribution sensor. In another embodiment, the sensor 77 comprises a high purity conductivity sensor. Circulation may be performed and/or altered responsive to a signal generated by the sensor 77. A flow sensor 78 may be similarly used to monitor uniformity of the first feed material. For example, if the first feed material includes components having substantially different viscosities, existence of a substantially constant flow rate through the circulation conduit 73 after multiple reversals of flow may indicate that the feed material is in a substantially uniform condition.

When uniform first feed material conditions are attained, first feed material may be supplied via valve 79 through a first flow control element 60 to a blending manifold 95, where the first feed material is mixed with a second feed material supplied from a second process material source 91 through a second flow controller 90. Flow rates and proportions of the first feed material and second feed material may be adjusted with the flow control elements 60, 90, respectively. From the blending manifold, a blend of any of the first feed material and the second feed material (possibly including further feed materials provided by additional feed material sources (not shown)) is supplied to a process tool or other point of use, such as one or more containers (e.g., for material storage and/or transport), or one or more tools employed for packaging blended process materials in one or more containers.

As will be recognized by one of ordinary skill in the art, any desirable flow control element(s) may be used to provide a desired type and degree of process material flow control. In one embodiment, one source of process material has no dedicated flow control element, while another source of process material does have a dedicated flow control element. A flow control element may be integrated into a blending manifold if desired. One or more sensors to measure parameters other than flow (e.g., particle count, particle size distribution, concentration, pH, conductivity, density, and composition) may be used in combination with a flow control element to ensure that a blend of suitable composition is provided. Flow control relative to dispensation of a pressure dispensed material (e.g., from one or more ATMI NOWPak™ containers) may be performed, for example, with any of the following methods:

I to P (current to pressure) or V to P (voltage to pressure) control of the supply pressure to the container to dispense through a fixed orifice;

I to P (current to pressure) or V to P (voltage to pressure) control of the supply pressure to the container with feedback via a flowmeter;

Control valve controlled via feedback of a flow meter; and

Monitoring weight of supply container with respect to time.

In a preferred embodiment, a flow control element comprises a flow controller. While flow controllers of various types may be employed, an example of a desirable flow controller type is the NT® Electronic Flow Controller (Entegris, Inc., Chaska, Minn., USA). The term "flow controller" will be used in several embodiments below. It is to be understood in each instance that other types of flow control elements may be substituted for flow controllers. In one embodiment, a flow control element comprises a manually or automatically actuated valve (e.g., including a needle valve or any other suitable type of valve with controllable flow characteristics).

Operation of any of the various elements of the system 50 may be amenable to automation, such as with a controller 96. Such controller 96 may further receive sensory input signals from various types of sensors (e.g., including, but not limited to, sensors 77, 78 and scales 59, 69) and take appropriate action according to pre-programmed instructions. In one embodiment, the controller 96 comprises a microprocessor-based industrial controller, personal computer, or the like.

In the context of semiconductor manufacturing, the use of liner-based containers for circulating process materials provides certain advantages over conventional systems utilizing mixed supply vessels. Use of pumps and accelerated pump wear (e.g., when circulating slurries) may be avoided. Liner-based containers permit process materials to be maintained in a zero-headspace or near zero-headspace condition, thus minimizing contact between process materials and environmental gases (e.g., air). Moreover, the disposable character of such liners dispense with the need for a periodic cleaning and maintenance of mechanically mixed process material supply tanks.

The circulation conduit 73 illustrated in FIG. 3 does not circulate process material through the blending manifold 95. When the circulation path outlet valve 79 disallows fluid communication between the circulation conduit 73 and a flow controller 60, process material disposed between the valve 79 and the blending manifold 95 may be subject to separation or stratification, depending on various factors including material properties, conduit dimensions, holding time, and the like. Accordingly, it may be more desirable in certain embodiments to extend a first material circulation flow path through a blending manifold, so as to eliminate any possibility of first material separation or stratification.

A process material delivery system including circulation of process materials through a blending manifold is illustrated in FIG. 4. The system 150 includes sources of four different process materials, including two sources configured for process material circulation. A first multi-constituent process material may provided by a first supply container 151A through a first flow controller 152 to a first circulation valve 157 disposed within a blending manifold 195. To maintain the first process material in a desirably uniform state, it may be circulated through one (e.g., normally open) port of the first circulation valve 157 to a first return container 151B. When it is desired to dispense the first process material into a common conduit 196 of the blending manifold 195, the first circulation valve 157 may be switched into dispensing operation by closing the (e.g., normally open) port to the first return container 151B, and opening another (e.g., normally closed) port to admit the first process material to the common conduit 196. Similarly, a second multi-constituent process material may be provided by a second supply container 161 through a second flow controller 162 to a second circulation valve 167 disposed within the blending manifold 195. The second process material may be maintained in a desirably uniform state by circulating same through one (e.g., normally open) port of the first circulation valve 167 to a second return container 161B. When it is desired to dispense the second process material into the common conduit 196, the second circulation valve 167 may be switched into dispensing operation by closing the (e.g., normally open) port to the second return container 161B, and opening another (e.g., normally closed) port of the valve 167 to admit the second process material to the common conduit 196. As illustrated in FIG. 4, the first process material may be a concentrated material including an abrasive, and the second process material may be a concentrated material including an inhibitor.

Third and fourth process material sources 171, 181 may supply third and fourth process materials to the common conduit 196 of the blending manifold 195 through flow controllers 172, 182 and (e.g., normally closed) valves 177, 187, respectively, without recirculation capability. Such recirculation may not be necessary, for example, where a process material includes a single component and/or is not subject to separation or stratification. As illustrated, the third process material may include hydrogen peroxide, and the fourth process material may include water. Any desired alternative process materials may be used.

Although FIG. 4 illustrates a specific grouping of valves 197 (including three-way valves 157, 167 and two-way valves 177, 187) within the blending manifold 195 to receive process materials from four sources 151A, 161A, 171, 181, is to be appreciated that any desired number or configuration of valves and/or other flow control devices may be provided in a given blending manifold 195, and that a blending manifold 195 may be configured to receive process materials from any desirable number of process material sources. In one example, one or more check valves to prevent reverse flow may be integrated into a blending manifold. In a preferred embodiment, a desired number of valves are provided (e.g., within or upstream of a blending manifold) to selectively permit or prevent flow of any selected material(s) through the manifold to obtain the desired blended product, flow rate, ration of selected materials, or the like at an outlet or discharge port of the blending manifold.

The blending manifold 195 may optionally include a flow-through mixer 198 (e.g., a static mixer) to promote mixing between two or more process materials of a desired process material blend to be supplied to a point of use such as a process tool or station thereof (e.g., first platen 23 of the process tool described in connection with FIG. 1B hereinabove.

For a system including multiple process tools and/or multiple processing stations thereof (or other desired multiple points of use), a dedicated blending manifold is preferably provided for each process tool and/or station (or each other point of use). Although FIG. 4 illustrates a second platen 25 and third platen 27 disposed adjacent to the blending manifold 195, each such platen 25, 27 preferably has a separate, dedicated blending manifold (not shown).

In one embodiment, at least one dispensing tool is coupleable with at least one blending manifold of a system as described herein, with the at least one dispensing tool being arranged to receive at least one blend of first and second process materials, and being adapted to dispense or otherwise deliver said at least one blend to at least one storage container. One or more dispensing tools may also serve to package one or more blends of process materials in various storage containers. Such packaging preferably serves to seal blended materials within at least one storage container. Storage containers containing blended materials may be staged for near-term use at another process tool proximate to the dispensing tool, or may be transported for use elsewhere.

FIG. 5 illustrates a blending manifold 200 configured to receive first and second process materials from first and second supply containers 201A, 202A, respectively, subject to circulation to first and second return containers 201B, 202B, respectively, through first and second circulation control valves 211, 212, respectively. The blending manifold 200 is further configured to receive third and fourth process materials from third and fourth process material supplies 203, 204, respectively, through control valves 213, 214, respectively. Each control valve 211, 212, 213, 214 preferably includes an associated check valve 211', 212', 213', 214' (optionally integrated along an outlet thereof in each instance into valves 211, 212, 213, 214, respectively) to inhibit reverse flow from a common conduit 219 of the manifold 200. If check valves 212'-214' are integrated into the corresponding control valves 212-214, then plugs 215-217 may be provided to retain the check valves 212'-214' into body portions of the respective control valves 212-214. Tees and/or other connection components may be provided to connect conduits for the various process materials to the common conduit 219. Each process material is desirably supplied through a dedicated flow controller (not shown) upstream of the blending manifold 200. The blending manifold 200 may further include an optional flow-through mixing element 218. A process tool 20 (such as described hereinabove), or alternatively, a material storage and/or transport container, is desirably disposed downstream of the blending manifold to receive a blend of any combination of the first through fourth process materials, with the composition and/or flow rate of such blend being subject to rapid change through operation of upstream flow controllers (not shown) and/or the control valves 211-214. The manifold 200 may be used, for example, to supply process materials to a (platen-containing) processing station of a planarization tool.

FIG. 6 illustrates a blending manifold 210 configured to receive a first process material from a first supply container 201 subject to circulation to a first return container 201B through a first circulation control valve 211. The blending manifold 210 is further configured to receive second and third process materials from second and third process material supplies 202, 203, respectively, through control valves 212, 213, respectively. Each control valve 211, 212, 213 preferably includes an associated check valve 211', 212', 213' (optionally integrated along an outlet thereof in each instance into with valves 211, 212, 213, respectively) to inhibit reverse flow from a common conduit 219 of the blending manifold. If check valves 212'-213' are integrated into the corresponding control valves 212-213, then plugs 215-216 may be provided to retain the check valves 212', 214' into body portions of the respective control valves 212, 213 Tees and/or other connection components may be provided to connect conduits for the various process materials to the common conduit 219. As before, each process material is desirably supplied through a dedicated flow controller (not shown) upstream of the blending manifold 210, and the blending manifold 210 may further include an optional flow-through mixing element 218. The blending manifold 210 is preferably disposed to supply a blend of any combination of the first through third process materials to a downstream process tool 20 (or other desired point of use), with the composition and/or flow rate of such blend being subject to rapid change through operation of upstream flow controllers (not shown) and/or the control valves 211-213.

FIG. 7 illustrates a blending manifold 220 configured to receive a first process material from a first process material supply 201 through a first control valve 211, and to receive a second process material supply 202 through a second control valve 212, wherein neither process material is subject to circulation through the blending manifold 220. Each control valve 211, 212 preferably has an associated check valve 211', 212'. A tee 215 and/or other interconnection component may be provided to connect conduits for the first and second process materials to the common conduit 219. As before, each process material is desirably supplied through a dedicated flow controller (not shown) upstream of the blending manifold 210, and the blending manifold 220 may further include an optional flow-through mixing element 218. The blending manifold 220 is preferably disposed to supply a blend of any desired proportion of the first and second process materials to a downstream process tool 20 (or other desired point of use). The manifold 220 may be suitable for use in supplying materials to a rinsing or pad cleaning station.

While FIGS. 5-7 illustrate specific blending manifold configurations, one skilled in the art will appreciate that similar blending manifolds may be constructed to mix any desirable number of process materials, with any or all process materials being subject to circulation through a blending manifold. If a redundant or backup container pair is provided for any particular process material to be supplied to a blending manifold, material within either or both containers of such redundant pair may be subjected to mixing or agitation when idle or at some desired time prior to use. Preferably, a control system initiates mixing between an "idle" backup container pair after a specified amount of material has been dispensed from (or when a threshold amount of material remains in) a corresponding "active" container pair. A control system may be programmed to predict or determine when to start mixing and switchover to a backup container pair before material is fully depleted from a corresponding "active" container pair. In one embodiment, a flow controller can be used to track or monitor the amount of material that has been dispensed from a given container pair, with a resulting signal being useable to initiate a container replenishment, container switchover operation, and/or container pair switchover operation.

FIG. 8 illustrates various components of at least a portion of process material delivery system 220, including redundant container pairs for a first process material subject to circulation through a blending manifold 242. While supply of only a single process material to a blending manifold 242 is illustrated in FIG. 8, is to be appreciated that additional process materials, with separate flow control, and whether or not subject to circulation, are subject to being supplied to the blending manifold 242 for blending of such materials at any desired adjustable flow and/or proportion, and for dispensation to a process tool (e.g., platen 23 of a CMP tool 20 as described hereinabove) or other desired point of use.

The delivery system 220 includes a primary first material supply container 221A, a primary first material return container 221B, a secondary first material supply container 221A, and a primary first material return container 221B, with a supply/return switching apparatus 231 permitting flow to be switched from a first state in which first process material from the primary first material container pair 221A, 221B feeds the blending manifold 242, to a second state in which first process material from the secondary first material container pair 221C, 221D feeds the blending manifold 242. When the primary material container pair 221A, 221B is subject to use, material from the primary first material supply container 221A is circulated through the supply/return switching apparatus 231, flow controller 240, blending manifold 242, backpressure manifold 244 (to regulate backpressure within the mixing manifold and prevent uncontrolled flow of the first process material to any of the containers during dispensing operation), and again through the supply/return switching apparatus 231 to the primary first material return container 221B. Either container pair may be selectively isolated using the supply/return switching apparatus 231. Before use, or when the secondary material container pair 221C, 221D is subject to use, material from the secondary first material supply container 221C is circulated through the supply/return switching apparatus 231, flow controller 240, blending manifold 242, backpressure manifold 244, and again through the supply/return switching apparatus 231 to the secondary first material return container 221D.

Use of primary and secondary first material container pairs 221A-221B, 221C-221D permits one container or container pair to be replaced with another container or container pair (e.g., containing said first material) without interrupting supply of first material to the blending manifold 242. The supply/return switching apparatus 231 may further be used to switch supply/return operation of a supply container 221A, 221C relative to a return container 221B, 221D without altering direction of first material flow through the flow controller 240, blending manifold 242, and back pressure manifold 244. The supply/return switching apparatus 231 may include any type and number of controllable valves, selected and configured as desired by one skilled in the art, to provide such functionality. Any of various sensors (not shown) may be connected to the supply/return switching apparatus 231 to enable automatic initiation of a switching operation. For example, a sensor may detect that level of process material in a given supply container is low, and therefore initiate switching of the supply/return switching apparatus 231 to allow process material to flow from another container (e.g., an associated return container, or a redundant supply container).

The system 220 preferably includes at least one of degassing, filtering, and level sensing utility, such as may be provided by a module 238 providing any or all of such utilities. Such module 238 is preferably disposed upstream of the flow controller 240 (or other type of flow control element). In one embodiment, such module 238 includes a reservoir (not shown) in which liquid-containing process material extracted is from a bottom portion thereof, and a gas is extracted from top portion thereof and directed to a vent. Level and/or presence of process material (e.g., comprising liquid) level in such a reservoir may be sensed with any suitable sensor disposed in sensory communication therewith.

Figure 9:
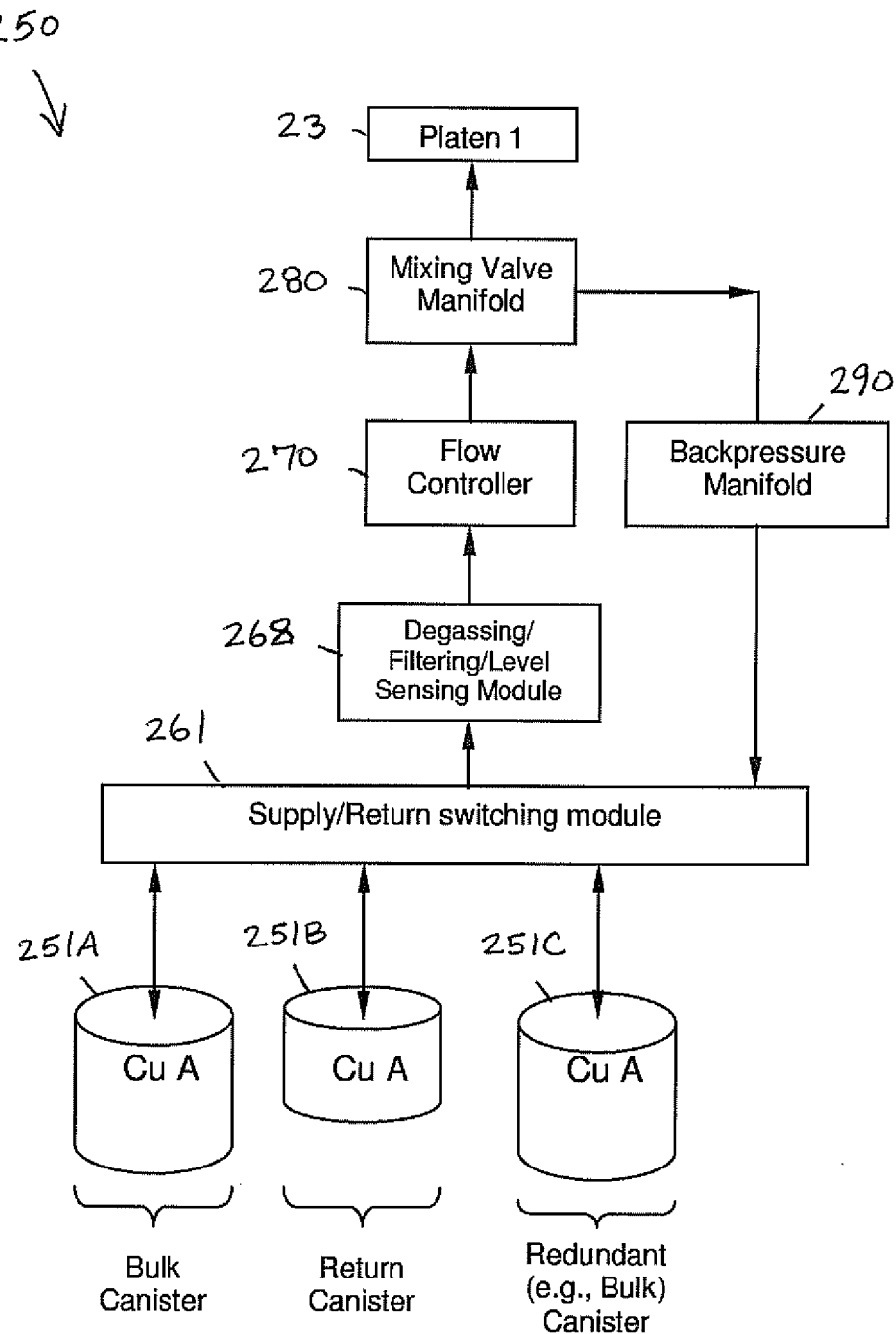
FIG. 9 is a schematic interconnection diagram illustrating connections between various components of at least a portion of a fifth process material delivery system according to an embodiment the present invention, including a supply container, a return container, and a backup container, with a switching module preferably adapted to switch flow between any of the containers.

A further embodiment utilizes three (rather than four) containers configured to permit a first process material to be circulated through a blending manifold, with any one container being subject to replacement with a replacement container replenished with first process material. Referring to FIG. 9, at least a portion of a process material delivery system 250 includes three containers 251A, 251B, 251C, which may be initially configured as a supply container 251A, return container 251B, and backup supply/return container 251C. A first process material initially disposed within the supply container may be circulated through a supply/return switching apparatus 261, flow controller 270, blending manifold 280, backpressure manifold, and again through the supply/return switching apparatus 261 to the return container 251B. If a substantial quantity of the first process material is provided to the return container 251B, then upon depletion of the supply container 251A, the supply/return switching apparatus 261 may be switched to enable the first-material-containing return container 251B to operate as a supply container, preferably with the backup return container 251C operating as a return container. Alternatively, the backup supply/return container 251C may initially contain a quantity of first process material, such that upon depletion of the initial supply container 251A, the supply/return switching apparatus 261 may be switched to enable to backup supply/return container 251C to operate as a supply container, preferably with the return container 251B serving as a return. Each container 251A, 251B, 251C may be independently isolated to permit such container to be swapped with a replacement container.

At least one additional process material having an associated flow controller (not shown) may be supplied to the blending manifold 280 and blended with the first process material in any desired proportion(s) and flow rates to generate a process material blend to be dispensed to a process tool (e.g., platen 23 of a CMP tool 20 as described hereinabove) or other desired point of use. As before, the system 250 preferably includes at least one of degassing, filtering, and level sensing utility, such as may be provided by a module 238 providing any or all of such utilities.

Figure 10:
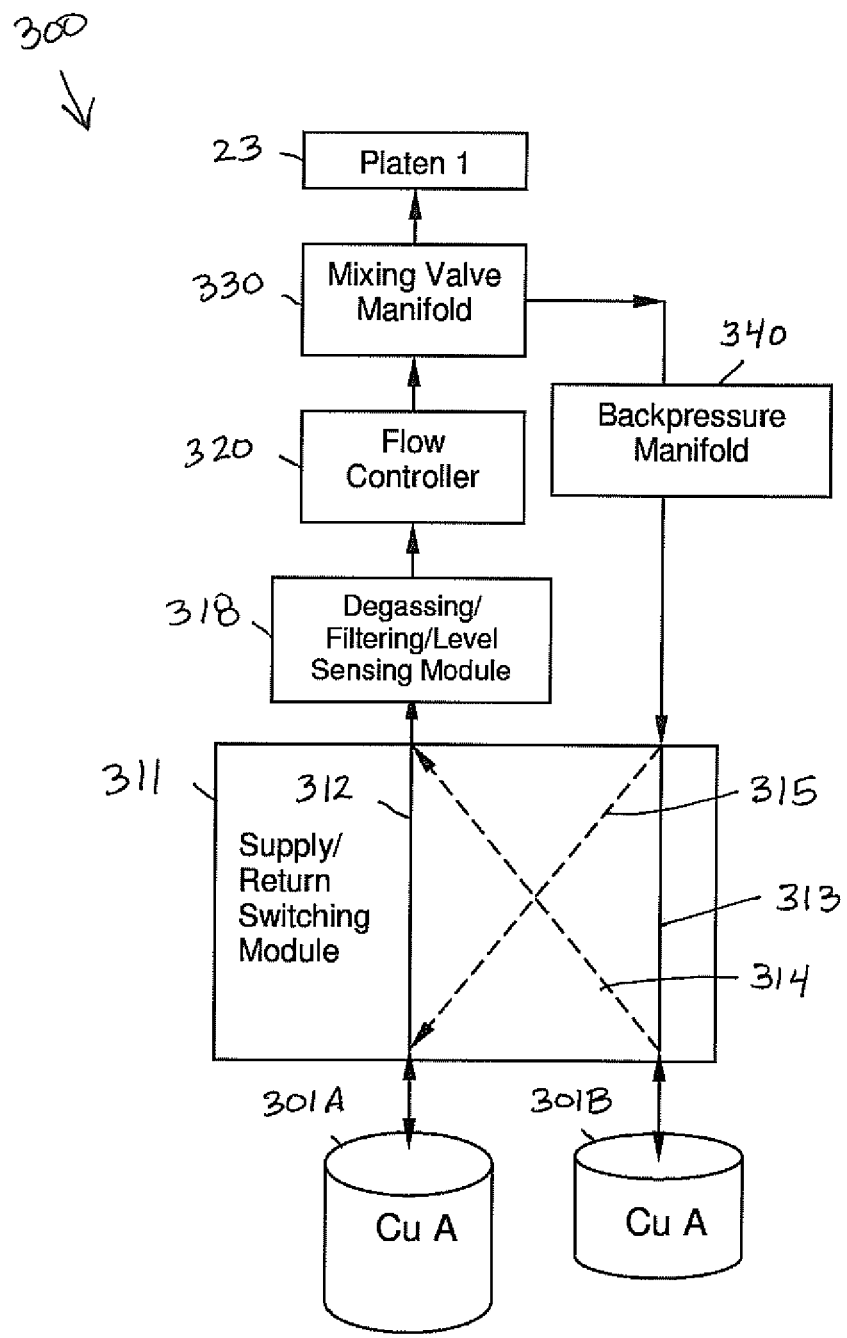
FIG. 10 is a schematic interconnection diagram illustrating connections between various components of at least a portion of a sixth process material delivery system according to an embodiment the present invention, including a supply container, a return container, and a supply/return switching module adapted to switch operation between the supply and return containers without affecting bulk flow direction through downstream system components.

FIG. 10 illustrates at least a portion of a process material delivery system 300 similar to the embodiments shown in FIGS. 8-9, but illustrating various switching flow paths 312-315 within a supply/return switching apparatus 311. The system 300 includes a process material supply container 301A and a process material return container 301B. Process material may be circulated from one container to the other through the supply/return switching apparatus 311, a flow controller 320, a blending manifold 330, a back pressure manifold 340, and again through the supply/return switching apparatus 311. In a first operating mode, the supply/return switching apparatus 311 establishes flow paths 312 and 313, enabling the process material supply container 301A to supply process material to the blending manifold 330, and enabling the process material return container 301B to receive material from the blending manifold 330. In a second operating mode, the supply/return switching apparatus 311 establishes flow paths 314 and 315, enabling the process material return container 301B to supply process material to the blending manifold 330, and enabling the process material supply container 301A to receive material from the blending manifold 330. In either operating mode, the direction of process material flows through the flow controller 320, blending manifold 330, and backpressure manifold 340 is unchanged.

At least one additional process material having an associated flow controller (not shown) may be supplied to the blending manifold 330 and blended with the first process material in any desired proportion(s) and flow rates to generate a process material blend to be dispensed to a process tool (e.g., platen 23 of a CMP tool 20 as described hereinabove) or other desired point of use. As before, the system 300 preferably includes at least one of degassing, filtering, and level sensing utility, such as may be provided by a module 318 providing any or all of such utilities.

Figure 11B:
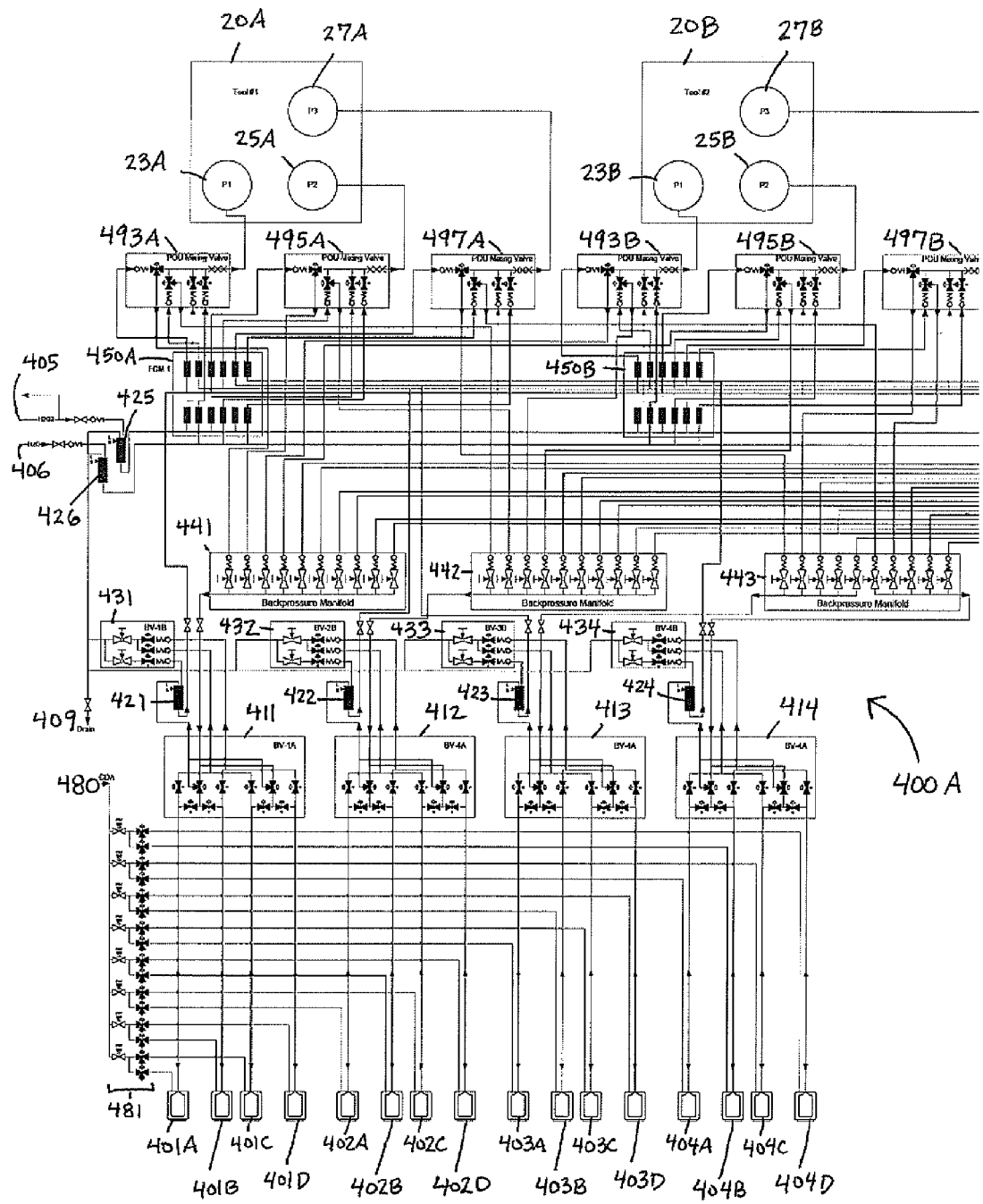
FIG. 11B is a magnified (left) portion of the interconnection diagram of FIG. 11A.

FIGS. 11A-11C illustrate a process material supply system 400 (with magnified portions 400A-400B illustrated in FIGS. 11B-11C) adapted to supply various combinations of (i) four different process materials supplied by pressure dispensing from redundant pairs of liner-based containers containing the four materials (sixteen containers in total) and (ii) two different line-fed process materials, to five different planarization tools each having at least platen-containing wafer processing stations 23A-23E, 25A-25E, 27A-27E. The system 400 includes fifteen blending manifolds 493A-493E, 495A-495E, 497A-497E, with one blending manifold being dedicated to each wafer processing station 23A-23E, 25A-25E, 27A-27E of the five planarization tools 20A-20E. As each wafer processing station 23A-23E, 25A-25E, 27A-27E includes a dedicated manifold, and each input to each manifold flow and composition of process materials supplied to each station 23A-23E, 25A-25E, 27A-27E of a tool 20A-20E may be independently controlled. In one embodiment, each processing station 23A-23E, 25A-25E, 27A-27E among all tools 20A-20E is independently controlled. In another embodiment, each corresponding set of processing stations 23A-23E, 25A-25E, 27A-27E for the tools 20A-20E may be controlled as a group. Such configuration still permits variation in material supply conditions between stations of a single tool, but does not permit variation in material supply conditions between corresponding stations of different tools.

A first material is supplied to and/or returned from the system 400 with two pairs of first material containers 401A-401B, 401C-401D; a second material is supplied to and/or returned from the system 400 with two pairs of second material containers 402A-402B, 402C-402D; a third material is supplied to and/or returned from the system 400 with two pairs of third material containers 403A-403B, 403C-403D; and a fourth material is supplied to and/or returned from the system 400 with two pairs of fourth material containers 404A-404B, 404C-404D. As shown, the containers 401A-401D, 402A-402E, 403A-403E, 404A-404E may be liner-based containers adapted for pressure dispensing by connection to an external pressure source 480 and various control valves 481. Additional process materials are supplied via direct line feed (i.e., without circulation capability) from sources 405, 406. Such additional process materials may include, for example, hydrogen peroxide and water, or any suitable one or more fluid materials. Each source 405, 406 may have an associated degassing/filtering/level sensing module 425, 426 to provide any one or more of degassing, filtering, and level sensing utilities.

A supply/return switching apparatus 411-414 is provided for each group of containers 401A-401D, 402A-402E, 403A-403E, 404A-404E, such as to permit one pair of containers of each group of containers to be operated instead of the other pair, for example, as the other pair of containers is replenished with process material, or as the other pair of containers is subject to mixing or agitation to preserve material therein in a homogeneous state of readiness for dispensing operation. Moreover, supply/return switching apparatus 411-414 is preferably further adapted to permit the operating mode of each container to be switched from supply mode to return mode, and vice-versa. Each supply/return switching apparatus 411-414 includes a plurality of independently operable control valves to provide the desired switching utilities. Each supply/return switching apparatus 411-414 supplies process material to a downstream degassing/filtering/level sensing module 421-424 adapted to provide any of said degassing, filtering, and level sensing utilities. Each module 421-424 is in selective fluid communication with a vent/drain module 431-434 to permit removal of undesirable gases, contaminants, filtrates, etc. Each supply/return switching apparatus 411-414 further receives return process material from a back-pressure manifold 441-443 for returning such material to a container of the group of containers 401A-401D, 402A-402E, 403A-403E, 404A-404E associated with the supply/return switching apparatus 411-414.

From each degassing/filtering/level sensing module 421-426, process materials are supplied to flow controller modules 450A-450E. Each of the first through sixth process materials is supplied to each flow controller module 450A-450E, with each flow controller module 450A-450E including multiple flow controllers. Flow of each process material supplied to a different blending manifold 493A-493E, 495A-495E, 497A-497E is controlled with a different flow controller.

Each blending manifold 493A-493E, 495A-495E, 497A-497E shown in FIGS. 11A-11E may conform in character to the blending manifold 200 described in connection with FIG. 5 hereinabove, with each blending manifold 493A-493E, 495A-495E, 497A-497E being adapted to receive two process materials subject to circulation, receive two process materials not subject to circulation, and produce a blend of the foregoing materials. Depending on the desired barrier removal process to be employed at the third platens, each blending manifold 497A-497E dedicated to a third station 27A-27E (P3) of each tool 20A-20E may alternatively conform in character to either of the blending manifolds depicted in FIG. 6 or 7. A plurality of planarization tools 20A-20E each including three wafer processing stations 23A-23E, 25A-25E, 27A-27E is disposed downstream of the blending manifolds 493A-493E, 495A-495E, 497A-497E. During circulation operation, first and second circulating process materials are circulated through the blending manifolds and returned to the containers 401A-401D, 402A-402E, 403A-403E, 404A-404E. During dispensing operation, a process material blend produced by each blending manifold 493A-493E, 495A-495E, 497A-497E is supplied to a corresponding wafer processing station 23A-23E, 25A-25E, 27A-27E.

Each blending manifold 493A-493E, 495A-495E, 497A-497E is adapted to receive two process materials subject to circulation. The system 400 includes four different process materials subject to circulation (relative to containers 401A-401D, 402A-402E, 403A-403E, 404A-404E). This means that different process materials may be supplied to different blending manifolds 493A-493E, 495A-495E, 497A-497E. This is consistent with the desired end use, in which each wafer processing station 23A-23E, 25A-25E, 27A-27E may have different wafer processing requirements.

To minimize lag time between process material blending and providing such a blend to a wafer processing station, conduit volume between the outlet of each blending manifold 493A-493E, 495A-495E, 497A-497E and the point where blended material is discharged to its associated wafer processing station 23A-23E, 25A-25E, 27A-27E should be minimized. This can be accomplished by reducing length of the conduit, and reducing diameter of the conduit. Positioning the blending conduit above a wafer processing station (or platen therein) may be desirable to allow dispensation of process material to be aided by gravity.

Operation of any of the various elements of the system 400 is preferably automated, such as with a centralized or distributed controller (not shown). Such a controller may further receive sensory input signals from various types of sensors and take appropriate action according to pre-programmed instructions. In one embodiment, a controller comprises a microprocessor-based industrial controller, personal computer, or the like. Remote user interface for such a controller, preferably including display and user input capabilities (e.g., a touch screen display) may be provided.

FIG. 12 provides a perspective view rendering of a portion of the system 400 of FIGS. 11A-11C. Sixteen containers 401A-401E, 402A-402E, 403A-403D, 404A-404D are provided in a room or enclosure 467, preferably disposed under a floor 468 relative to a plurality of planarization tools (not shown). The volume of each supply vessel may be larger (e.g., 180L) than each associated return vessel (e.g., 40L). Flow controller modules 450A-450E may be disposed in cabinets outside the enclosure 467, along with cabinets 466 housing valves and control components. A remote interface 479 may be provided in wired or wireless communication with the system 400 to provide display and user input capabilties.

Although liner-based pressure dispensing containers for dispensing process materials have been described hereinabove, systems and methods according the present invention are not limited to the use of such specific containers. Material contents of a first bladder disposed within a cavity of a rigid or semi-rigid container may be dispensed by inflating a second bladder (e.g., self-inflating by chemical reaction therein, or by addition of a working fluid supplied by an external pressure source) similarly disposed within the cavity and positioned to exert pressure against the first bladder. Liner-utilizing or liner-less containers may be used for piston-actuated, spring-actuated, or other types of pressure dispensing. Pumps of various types (e.g., reciprocating, positive displacement, peristaltic, etc.) may be used. Gravity-aided pumping may be used. In one embodiment, and with reference to FIGS. 13A-13B, a dispensing apparatus 500 for dispensing process material may include a pressure cabinet 503 having a rotatable door 505 having associated door seals 506. A collapsible container 501 or container containing a collapsible portion (or liner) may be inserted through the rotatable door into the pressure cabinet 503. A pressurizing fluid (e.g., air, nitrogen, water, etc.) may be controllably supplied to the pressure cabinet 503 to force process fluid from the collapsible container 501 through a discharge line (not shown).

Use of liquid as a pressurizing fluid is may be particularly desirable to avoid migration of pressurized gas through a collapsible liner (e.g., through pinhole leaks in such liner) to contact process material contained therein, as gas bubbles entrained in such liquid may cause erroneous instrument measurements, and may detrimentally interact with such liquid. Moreover, use of an incompressible fluid (liquid), instead of a compressible gas, allows for greater force to be applied to the outside area of a liner. This increase in force leads to higher dispense pressures, and enables the user to overcome long or high pipe runs. Such working liquid may be supplied through a supply valve (not shown) to the interstitial volume between a container and a collapsible liner therein, Pressurization of such working liquid may be controlled with an actuatable "master" cylinder, as in conventional hydraulic systems. As force is applied to the master cylinder, the working fluid translates the force to the liner (containing material to be dispensed) and forces the material from the liner through a dispense port. Reduced gas penetration through the liner, increased force applied to the liner and material disposed therein, and potential for improved flow control are all benefits afforded by using a liquid as a working material for liner-based pressure dispensation.

Containment materials (e.g., liners, lining materials, container materials, conduits, etc.) intended to contact process materials according to various embodiments of the invention should be compatible in character with such process materials—for example, without promoting reaction or degradation of such process materials. If a material containment liner is subject to gas contact (e.g., for pressure dispensing), then an interior and/or exterior surface of such liner may be covered or coated with a gas-impermeable or gas-impenetrable material. Alternatively, a liner may be formed of a selectively or semi-permeable material to permit fluid introduction through the liner when desired. A liner may be formed of substantially pure single material layers, or may be formed of multiple layers of different materials. A desirable liner should be characterized by acceptably high degrees of structural integrity, elasticity, flexibility, and reliability (e.g., mean time between failures) suitable for the desired end use application.

The process material delivery system 400 and similar systems according to the present invention as described herein eliminate the need for global process material distribution loops in supplying multiple process tools and/or processing stations (or other desired points of use). As global loops inherently entail variations in delivery pressure for multiple tools or stations receiving material therefrom, elimination of global loops reduced variability in the supply of process materials to multiple points of use.

Blending process materials as required just prior to the point of use provides numerous benefits. It enables use of highly concentrated chemistries or materials that last longer than conventional pre-blended formulations. It enables process material compositions to be varied as a function of time during an uninterrupted material (e.g., semiconductor device) processing step. In performing planarization of delicate structures (e.g., structures that may be prone to any of mechanical deformation, cracking, and fracture, as depending on factors such as pattern density, feature aspect ratio, and sub-structure material composition), variation of process material composition may be useful to achieve desired removal rates without applying high downforce from a polishing head on such structures. An example of delicate structures includes wafers coated with porous, low K materials (e.g., dielectric films), as they are prone to stress cracking and delamination when exposed to high polishing downforces; accordingly, such materials are typically polished with a polishing head downforce of around 1 psi (7 kPa). The ability to controllably vary process material composition further enables optimization of sequential multi-step processing operations to maximize throughput. On a wafer processing tool including sequential polishing stations P1, P2, and P3, such optimization may include, for example, reducing P1, P2, or P3 time; reducing total P1, P2, and P3 time; reducing total P1 and P2 time; and balancing any of P1, P2, and P3 times.

Algebraic balancing formulas for accomplishing such goals may be developed by one skilled in the art with the benefit of the instant disclosure. Factors to be considered in trying to improve throughput of a polishing tool include, but are note limited to: type of polishing tool; chemical and mechanical properties of the polishing pad(s); type of material to be removed; amount of material to be removed and/or desired endpoint thickness profile; chemical and mechanical properties of the CMP formulation; and downforce exerted onto the wafer. Suitable selection and adjustment of the foregoing and other factors is within the skill of one having ordinary skilled in the art.

FIG. 14 describes wafer processing parameters as applied to a multi-station semiconductor planarization tool, with a blend of process material having composition that varies with respect to time being supplied to the first station P1. The tool includes three stations P1-P3, which may be used to perform sequential bulk copper removal (P1), copper clearing (P2), and barrier removal (P3) processes. As described in the center column of FIG. 14, a conventional method for operating a multi-station tool utilizes the same pre-blended CMP composition at station P1 and P2. As described in the right column, an uninterrupted planarization operation at the station may be divided into two ("early" versus "late") processes each employing a different process material composition. A P1 early process may include a composition denoted "VUL" for a period of 35 seconds at a removal rate of approximately 10,000 Angstroms/second. Without interrupting operation of the P1 platen, a P1 late process is initiated by substituting supply of a second composition denoted "VAZ" for the prior "VUL" composition, with the VAZ composition providing a removal rate of approximately 6,000 Angstroms/second. Whereas the P1 early removal process using VUL is characterized by fast removal with high planarization efficiency, the P1 late removal process using VAZ is characterized by slower removal, with low defectivity and a low dishing rate. ("Dishing" refers to the formation of undesirable recesses in deposited surface features such as copper lines or bond pads.) As further indicated in the third column, "VUL" and "VAZ" may be formed by blending in various proportions deionized water ("DIW"), hydrogen peroxide, and concentrated materials "V1-UL 3.6×" (used in both VUL and VAZ) and "AZ 10×" (used in VAZ only). As described, V1-UL may be formed by blending 5 parts of V1-UL 3.6× plus 10 parts DIW plus 3 parts of hydrogen peroxide. VAZ may be formed by blending 5 parts of V1-UL 3.6× plus 10 parts DIW plus 3 parts of hydrogen peroxide plus 2 parts of AZ. Following P1 processing, VAZ may be used on the wafer product in the P2 process for a period of up to 60 seconds. P3 processing is unchanged in character relative to conventional P3 processing, but buffing requirements may be reduced due to improvements in wafer surface condition due to employ of the P1 early/P1 late hybrid process.

Benefits of optimizing sequential processing steps of multi-station planarization tool are apparent by comparing FIG. 15 to FIG. 16. FIG. 15 provides a bar chart representing wafer processing time for various stations of a multi-station semiconductor planarization tool employing conventional process material supply systems and processing methods. As illustrated, processing times in seconds at stations P1, P2, P3, BB1, and BB2 (representing platens 1, 2, and 3, and brushed cleans 1 and 2) are 60, 120, 70, 30, and 30, respectively. Processing at station P2 includes base process, base overpolish, and extended overpolish steps that utilize the same process materials, but may employ different operating parameters (e.g., pad pressure, pad speed, etc.) relative to one another. The 120 second processing time at station P2 represents a clear bottleneck in production, as that period far exceeds processing time at any other station in the tool.

FIG. 16 provides a bar chart representing improved wafer processing time for various stations of a multi-station semiconductor planarization tool employing at a first station thereof a process material with a time-varying composition, according to systems and methods according to various embodiments of the present invention. In particular, variation of composition of first material supplied to the first station from VUL to VAZ during processing at such station permitted much shorter processing time at the second station (60 seconds versus 120 seconds), and even effected reduction of processing time at the third station (60 seconds versus 70 seconds). The basic principle behind the foregoing operation is to shift aspects of the original P2 process to the P1 process (e.g., during the "late P1" period). Processing time may be reduced at station P1 to accommodate former P2 processes, for example, by increasing bulk copper removal rate during "early P1" processing (e.g., using VUL).

FIG. 17 is a table providing test data, including processing time and dishing measurements, obtained for various test processes employed by first and second platens of a multi-station semiconductor planarization tool utilizing systems and methods as described herein, in comparison to conventional processes. Certain data sets represent processes in which composition to at least the first platen is varied during wafer processing thereon (e.g., including an early P1 step employing VUL, and a late P1 step employing VAZ). The first entry represents a desirable result, in which processing times at both Platen 1 (P1) and Platen 2 (P2) are nearly matched at acceptably low values of 60 seconds and 57 seconds, respectively, and dishing measurements are acceptably low.

FIGS. 18A and 18B provide first and second superimposed line charts illustrating time-dependent blend composition profiles, including flow (in milliliters per minute) as a function of time (in seconds) for various components of blends of multiple process materials, as supplied to a first station of a semiconductor planarization tool during wafer processing. Each line chart represents three constituents: (A) deionized water, (B) a composition denoted "Cu-A" plus peroxide, (C) a composition denoted "Cu-B," with item (D) representing total (composite) flow. It is noted that the flow measurements provided in FIGS. 18A-18B are taken from flow controllers disposed upstream of the tool outlet nozzle, with a calculated delay time of 14 seconds at a total flow rate of approximately 100 milliliters per minute.

Referring to FIG. 18A, starting at time of 0 seconds, a "flood" condition is established for 10 seconds to initiate material blending in an upstream blending manifold, and convey sufficient material to the tool to purge a supply conduit between the blending manifold and tool of any static material. At a time of 10 seconds, flows of constituents A, B, C are reduced to desired levels to produce a desired flowrate of a first "VUL" blend, and an "early P1" polishing process (e.g., performing bulk copper removal) commences. At a time of 16 seconds, flow of constituent A is reduced and flow of constituent C is increased to produce a second "VAZ" blend, but due to the material transit delay time (e.g., 14 second transit delay) from the blending manifold to the process tool (or other desired point of use), such VAZ blend does not arrive at the tool until a time of 30 seconds (i.e., 16 second start time plus 14 second delay). From the time period of 30 seconds to 60 seconds, "late P1" processing commences with the VAZ blend.

FIG. 18B illustrates a similar result, but with a longer "early P1" interval and shorter "late P1" interval. Referring to FIG. 18B, starting at time of 0 seconds, a "flood" condition is established for 10 seconds. At a time of 10 seconds, flows of constituents A, B, C are reduced to desired levels to produce a desired flowrate of a first "VUL" blend, and an "early P1" polishing process (e.g., performing bulk copper removal) commences. At a time of 26 seconds, flow of constituent A is reduced and flow of constituent C is increased to produce a second "VAZ" blend, but due to the material transit delay time (e.g., transit delay of 14 seconds) from the blending manifold to the process tool (or other desired point of use), such VAZ blend does not arrive at the tool until a time of 40 seconds. From the time period of 40 seconds to 60 seconds, "late P1" processing commences with the VAZ blend.

As will be appreciated by one of ordinary skill in the art with the benefit of the instant disclosure, any suitable combination of two or more process materials may supplied to a blending manifold at desired flow rates and proportions, and the blended product supplied to a process (e.g., during uninterrupted process operation) to achieved the desired result with respect to a multi-step sequential or other process operation. In one embodiment, process material precursors that are reactive with one another may be combined in a blending manifold just prior to dispensation to supply a product of the reaction thereof to a process tool or other desired point of use.

Wafer-to-wafer and within-wafer-uniformity (WIWNU) polishing uniformity have also been demonstrated using a system and method according to the present invention. FIG. 19A includes superimposed plots of copper removal rate profiles (Angstroms/min) data as a function of wafer position obtained for two wafers polished with a premixed composition denoted VAZ supplied from a reservoir. FIG. 19B includes superimposed plots of copper removal rate profiles (Angstroms/min) data as a function of wafer position obtained for two wafers polished with composition denoted VAZ blended at or near the point of use using concentrated process material constituents. Better polishing results are demonstrated FIG. 19B than FIG. 19A, as apparent from the lower degree of removal variability shown in FIG. 19B.

FIG. 20 is a line chart depicting predicted and actual copper removal (Angstroms) as a function of polish time (seconds) for polishing wafers in a first station of a planarization tool with a composition denoted as "VUL" in a first process segment followed without interruption by polishing with a composition denoted as "VAZ" in a second process segment. The upper superimposed lines provide predicted and actual data for polishing including a 30 second duration first process segment with VUL, followed by periods of 15, 25, and 35 seconds, respectively, of polishing with VAZ in a second process segment. The lower superimposed lines provide predicted and actual data for polishing including a 25 second duration second process segment with VAZ, as preceded by periods of 20, 30, and 40 seconds, respectively, of polishing with VUL in a first process segment. In each case, VAZ and VUL were formed according to systems and methods disclosed herein by blending multiple constituents (including concentrated slurry-containing compositions) immediately prior to use in a blending manifold disposed adjacent to a planarization tool. The illustrated linear removal with respect to time, and close agreement between calculated and measured removal rates, demonstrates predictable planarization performance using concentrate-derived, point-of-use process material blends with blend composition subject to change during a continuous wafer planarization process, such that systems and methods disclosed herein may be applied to algebraically balance steps of a multi-step sequential wafer planarization process.

Examples illustrating steps employable in optimizing (e.g., algebraically balancing) a multi-step sequential wafer planarization process will be explained with reference to FIGS. 21A-21D. FIG. 21A provides typical thickness ranges (in kiloAngstroms) for the bulk and landing layers deposited over a microelectronic device substrate, prior to application of a chemical mechanical planarization process thereto. FIGS. 21B-21C provide examples of various layers deposited over a microelectronic device substrate, including specific bulk and landing layer thicknesses, prior to application of a chemical mechanical planarization process thereto In a typical CMP system that includes three platens P1, P2, P3 (as illustrated in FIGS. 1A, 1B, and 2) adapted for sequential processing steps, a first platen P1 endpoint ("EP") system monitors copper (Cu) thickness and generates an instruction to stop polishing upon detection of an endpoint criterion (e.g., predefined thickness at dashed line). Similarly, a second platen P2 EP system generates an instruction to stop polishing when it (e.g., optically) detects that Cu has been removed. Removal rate in the following discussion may be abbreviated as "RR." Optimization should start with looking at the polishing time of P1, P2 and P3, wherein:

$P1$ time $(t_{P1})$=Bulk Cu Thickness/RR(Bulk)

$P2$ time $(t_{P2})$=Cu Thickness(Landing)/RR(Landing)

$P3$ time $(t_{P3})$=Barrier Thickness/RR(Barrier)

For example, if P1 time=60 seconds; P2 time=80 seconds; and P3 time=100 seconds, then P2 and P3 are bottlenecks and their polishing times should be balanced first.

Referring to FIG. 22B, which discloses an 8,000 Angstrom bulk layer disposed over a 3,000 Angstrom landing layer:

Typically, $RR_{P1}$=4,000 to 15,000 A/min and $RR_{P2}$=1, 500 to 2,500 A/min.

If $RR_{P1}$=5,000 A/min and $RR_{P2}$=1,700 A/min, then $t_{P1}$=8,000 A/5,000 A/min=96 s, and $t_{P2}$=3,000 A/1,700 A/min=106 s This result is relatively balanced, as the time difference between $t_{P1}$ and $t_{P2}$ is fairly small on a relative basis.

Assume the following change in parameters:

If $RR_{P1}$=10,500 A/min, and if $RR_{P2}$ remain the same as in the preceding Example, then:

$t_{p1}$=8,000 A/10,500 A/min=46 s, and $t_{p2}$=3,000 A/1,700 A/min=106 s.

This result is unbalanced, as the time difference between $t_{P1}$ and $t_{P2}$ is very large on both absolute and percentage bases.

To balance P1 and P2 time, then more Cu can be removed at P1, as illustrated in FIG. 21C. In particular:

If $RR_{P1}$ and $RR_{P2}$ remain the same as above, then:

$t_{P1}$=9,500 A/10,500 A/min=54 s, and $t_{P2}$=1,500 A/1,700 A/min=53 s

This result is balanced with respect to processing time at platens P1 and P2.

FIG. 21D is a schematic cross-sectional view of a third example of various layers deposited over a microelectronic device substrate, showing a first portions of a bulk layer to be removed by a "P1 early" process segment, and a second portion of the bulk layer to be removed by a "P1 late" process segment. It is assumed that the landing layer will be removed by platen P2. With reference to FIG. 21E, the barrier and dielectric layers may be processed with a third platen P3 of a multi-station CMP tool. When polishing the barrier material and dielectric layer, two or more polishing formulation which are optimized for each layer can be blended on the fly and delivered to P3.

Based on the foregoing, a general set of balancing formula/ equations for may be provided $$\Sigma t_{P1} \approx \Sigma t_{P2} \approx \Sigma t_{P3}$$

and $$t_{P1,early} + t_{P1,late} \approx t_{P2}$$

Thus, various steps of a multi-step sequential wafer planarization process may be optimized and/or algebraically balanced to improve tool utilization and process efficiency. Overall goals are to shorten the individual processing times per station (e.g. $\Sigma t_{P1}$) and balance the station processing times with respect to each other. The station with the longest total processing time determines and limits the tool throughput.

In one embodiment, a process material blend may be formed from process materials or process material precursors characterized by different particle size distribution profiles. A slurry composition with a higher particle size may be desirable for removing a bulk material film, and a slurry composition with a lower particle size may be desired as material thickness is reduced. The percent solution including a first constituent having a larger particle size may diminish gradually as a second constituent having a smaller particle size is added to ensure that flow rate remains substantially constant. Chemical additives (e.g., chelating agents, oxidizers, inhibitors, etc.) may also be adjusted as the particle size distribution is varied with respect to time.

FIG. 22A includes flow parameters as a function of time for time periods within 0 to 120 seconds (at left) for producing a blended process material including a first process material precursor having the illustrated particle size distribution profile (at right), with the first process material precursor having a discernable particle size distribution peak at 75 nanometers. FIG. 22B includes flow parameters as a function of time for time periods within 0 to 120 seconds (at left) for producing a blended process material including a second process material precursor having the illustrated particle size distribution profile (at right), with the second process material precursor having a discernable particle size distribution peak at 25 nanometers. FIG. 22C includes flow parameters as a function of time for time periods within 0 to 120 seconds (at left) for producing a blended process material including a third process material precursor having the illustrated particle size distribution profile (at right), with the third process material precursor having a discernable particle size distribution peak at 50 nanometers. FIG. 22D includes precursor flow parameters as a function of time for time periods within 61 to 90 (at left) for first, second, and third process material precursors having the particle size distribution profiles illustrated in FIGS. 22A-22C combined to yield a time-dependent process material blend, with superimposed first, second, and third overlapping particle size distribution profiles (at right).

Accordingly, change in composition of a blended process material may include not only changes in chemical composition, but also changes in compositional parameters such as particle size, particle type (e.g., crystal structure) isomer content, and the like. In certain embodiments, biological composition may also be subject to change with time.

FIGS. 23A-23B provide tables of compositional information for compositions denoted as "VAZ," "VAZ-X" (4.3× dilution), "VAZ-D" (4.33× dilution), and "VAZ-C." "PVP" in such figures refers to polyvinylpyrrolidone (a nonionic water-soluble polymer), and "SEA" refers to hydroxypropyl cellulose. The "abrasive" listed in the tables is non-specific as to any particular type, but a desirable abrasive for CMP formulations includes DP6190 colloidal silica (Nyacol Nano Technologies, Inc., Ashland, Mass., USA).

Figure 24:
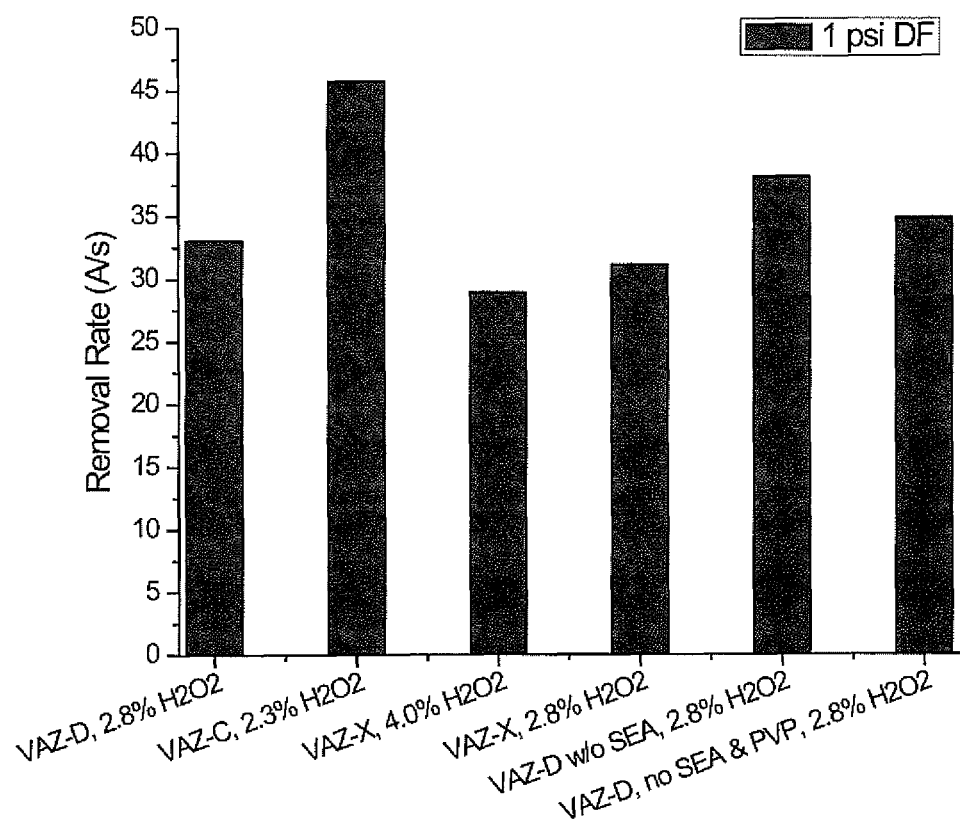
FIG. 24 is a bar chart depicting copper removal rates (Angstroms per second) obtained with multi-constituent planarization process materials having the same, or similar, compositions as those disclosed in FIG. 23B.

FIG. 24 is a bar chart depicting copper removal rates (Angstroms per second) obtained with multi-constituent planarization process materials having the same, or similar, compositions as those disclosed in FIG. 23B. Compositions with different removal rates may be obtained by blending various process materials as needed immediately upstream of the point of use. This demonstrates the potential desirability of tailoring slurry compositions to achieve specific polishing times with a particular process.

As indicated previously, novel systems and methods disclosed herein may be used to prepare any desired formulation utilizing multiple feed materials, preferably including at least one (and preferably multiple) concentrated feed materials. Desired blended products include CMP slurry compositions suitable for various planarization steps, including slurries with increased planarization efficiency of copper films. In one embodiment, a blended end product comprises a copper (Cu) CMP slurry (i.e., a CMP slurry suitable for planarizing copper layers) that may include, for example, at least one abrasive agent, at least one solvent, at least one passivating agent and at least one anti-flocculating agent. Preferably, the at least one anti-flocculating agent is a polymeric additive. In another embodiment, a blended end product may comprise a Cu CMP slurry including at least one abrasive agent, at least one solvent, and at least one chelating agent. In another embodiment, a blended end product may comprise a Cu CMP slurry including at least one abrasive component, at least one solvent, at least one passivating agent, at least one polymeric additive, at least one chelating agent, at least one antimicrobial agent, at least one defoaming agent, at least one rheology agent, and at least one buffering agent. In another embodiment, a blended end product may comprise a Cu CMP slurry composition including at least one abrasive component, at least one solvent, at least one passivating agent, and at least one polymeric additive, wherein the weight percent ratio of the passivating agent relative to the polymeric additive is in a range from about 1:1 to 20:1; and the weight percent ratio of the abrasive relative to the polymeric additive is in a range from about 2:1 to 50:1.

In one embodiment, fluid supply systems and methods as described herein are applied to polish a microelectronic device substrate having metal and a barrier layer material, with the method including (a) contacting such device substrate on the platen for sufficient time and under Cu CMP conditions with a first CMP composition to substantially remove metal from the microelectronic device substrate and expose barrier layer material, wherein said Cu CMP composition comprises at least one abrasive, at least one solvent, at least one passivating agent and at least one polymeric additive; and (b) contacting the device substrate having barrier layer material thereon on the same platen for sufficient time and under barrier CMP conditions with a barrier CMP composition to substantially remove barrier layer material from the microelectronic device substrate, wherein the barrier CMP composition comprises at least one passivating agent, at least one selectivity modifying additive, at least one solvent, at least one abrasive, and optionally at least one oxidizing agent.

In one embodiment, systems and methods employing multiple containers as disclosed herein include Cu CMP composition reagents, wherein (a) a Cu CMP composition comprises at least one passivating agent, at least one polymeric additive, at least one abrasive agent, and at least one solvent, and wherein (b) one or more additional components suitable for combination with the Cu CMP composition to form a barrier CMP composition are provided in one or more containers, wherein the one or more additional components are selected from the group consisting of at least one barrier layer removal enhancer, at least one selectivity enhancer, and combinations thereof.

In one embodiment, systems and methods as disclosed herein utilize an additive that causes bridging flocculation, selected from the group consisting of water soluble polymers (WSPs) and cross-linked acrylic acid based polymers, and an anti-flocculating agent, to stabilize chemical mechanical polishing (CMP) formulations against flocculation from hydrogen bonding mechanisms.

Although embodiments of the present invention has been described with reference to CMP formulations suitable for use with copper, and the chemical mechanical planarization of wafers containing copper, the invention is not so limited. Formulations useful for chemical mechanical planarization of other wafer materials such as, for example, noble metals, may be similarly blended and delivered at or near the point of use utilizing systems and processes herein. The design of such systems and processes will be readily apparent to one of ordinary skill in the art following the teachings provided by this application.

Systems and methods as described herein are not limited to the specific application of CMP. In additional embodiments, systems and methods as described herein may be used to blend and/or dispense process materials such as photoresist removers, pCMP formulations, and cleaning solutions used in semiconductor and/or microelectronic applications. Inventive systems and methods as described herein have broad applicability outside the foregoing fields, and may be used in any context requiring blending and/or delivery of two or more substances or components, such as at the point of use. For example, in further embodiments, systems and methods as described herein may be adapted for use in (A) production of food or beverages consumable by people or animals; (B) chemical production; (C) pharmaceutical production; (D) biomaterial production; and (E) bioprocessing.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various elements and steps disclosed separately herein may be aggregated in different combinations and permutations to provide additional advantage(s) as may be desirable for a particular end use or application. Correspondingly, the invention as hereinafter claimed is intended to be broadly construed and interpreted, as including all such variations, modifications and alternative embodiments, within its spirit and scope.

What is claimed is:

1. A system adapted for use with at least one manufacturing process tool having a plurality of independently controllable processing stations, the system comprising:
a first interface to a common source of a first process material configured to provide said first process material for use by said at least one manufacturing process tool, wherein the source of first process material comprises a plurality of first containers adapted to contain said first process material;

a second interface to a common source of a second process material configured to provide said second process material for use by said at least one manufacturing process tool;

a plurality of blending manifolds including a dedicated blending manifold for each processing station of the plurality of processing stations;

for each blending manifold of the plurality of blending manifolds, at least one flow control element adapted to regulate delivery to the blending manifold of any of the first process material and the second process material; and a first circulation apparatus adapted to circulate at least a portion of said first process material through at least one first circulation flow path between at least two containers of said plurality of first containers;

wherein the system comprises at least one of the following features (A) and (B):

(A) the at least one first circulation flow path extends through said plurality of blending manifolds; and (B) each container of the plurality of first containers comprises: (i) a collapsible liner comprising a flexible film material and defining a process material port for ingress or egress of process material relative to the container, (ii) a housing adapted to contain the collapsible liner, said housing defining at least a first orifice adapted to receive the first port, wherein the housing and the liner define a sealable volume therebetween, and wherein the housing is more rigid than the liner; and (iii) a fluid feed passage coupleable to at least one pressure source adapted to modify pressure within the sealable volume to promote ingress or egress of process material through the process material port.

2. The system of claim 1, further comprising:

a supply/return switching apparatus fluidically coupled between (i) the plurality of blending manifolds, and (ii) the plurality of first containers;

wherein the supply/return switching apparatus is adapted to selectively change an operating mode of a first container of the plurality of first containers from supply mode to receive mode, and to change an operating mode of a second container of the plurality of first containers from receive mode to supply mode, and vice-versa.

3. The system of claim 1, wherein the plurality of first containers comprises a first supply container, a first return container, and at least one of a first backup supply container and a first backup return container adapted to contain said first process material, the system further comprising:

a supply/return switching apparatus fluidically coupled between (i) the first supply container, the first return container, and said at least one of a first backup supply container and a first backup return container, and (ii) the plurality of blending manifolds;

wherein the supply/return switching apparatus is adapted to substitute operation of (a) said at least one of a first backup supply container and a first backup return container for (b) at least one of said first supply container and said first return container.

4. The system of claim 1, wherein the at least one manufacturing process tool comprises a plurality of manufacturing process tools.

5. The system of claim 1, wherein said first process material comprises a plurality of compositionally different constituents.

6. The system of claim 1, wherein the at least one flow control element comprises a first flow control element adapted to regulate delivery of the first process material to the plurality of blending manifolds, and a second flow control element adapted to regulate delivery of the second process material to the plurality of blending manifolds.

7. The system of claim 1, wherein the at least one first circulation flow path extends through said plurality of blending manifolds.

8. The system of claim 1, wherein each container of the plurality of first containers comprises: (i) a collapsible liner comprising a flexible film material and defining a process material port for ingress or egress of process material relative to the container, (ii) a housing adapted to contain the collapsible liner, said housing defining at least a first orifice adapted to receive the first port, wherein the housing and the liner define a sealable volume therebetween, and wherein the housing is more rigid than the liner; and (iii) a fluid feed passage coupleable to at least one pressure source adapted to modify pressure within the sealable volume to promote ingress or egress of process material through the process material port.

9. The system of claim 8, wherein the first circulation apparatus comprises a reversible-flow circulation apparatus in least intermittent fluid communication with the liner of each container of the plurality of first containers.

10. The system of claim 9, wherein the first circulation apparatus comprises:

a fluid path including at least one fluid conduit; and a plurality of valves;

wherein said at least one pressure source is adapted to cyclically move the at least a portion of the first process material in a first direction and in a second direction between at least two containers of the plurality of first containers to promote maintenance of said first process material in a desired condition.

11. The system of claim 1, further comprising at least one of a degasser and a filter fluidically coupled between the first interface and said at least one flow control element.

12. The system of claim 1, wherein each blending manifold of the plurality of blending manifolds comprises a flow-through mixing element adapted to aid mixing between said first process material and second process material.

13. The system of claim 1, further comprising:

at least one of a first degasser and a first filter fluidically coupled between the first interface and the at least one flow control element; and at least one of a second degasser and a second filter fluidically coupled between the second interface and the at least one flow control element.

14. The system of claim 1, further comprising at least one backpressure manifold in fluid communication with the plurality of blending manifolds, wherein the backpressure manifold is adapted to inhibit uncontrolled flow of said first process material to said first interface during dispensing operation.

15. The system of claim 1, further comprising an interface to a common source of a third process material configured to provide said third process material for use by the at least one manufacturing process tool; wherein each blending manifold of the plurality of blending manifolds has associated therewith a third flow control element adapted to regulate delivery to the blending manifold of the third process material.

16. The system of claim 1, wherein the at least one manufacturing process tool comprises at least one semiconductor processing tool.

17. The system of claim 16, wherein the at least one semiconductor processing tool comprises a planarization tool, and wherein the first process material comprises a chemical mechanical planarization slurry.

18. A method utilizing the system of claim 1 for supplying process material to a microelectronic device processing tool that includes a plurality of semiconductor or microelectronic device processing, the method comprising:
- independently regulating supply each of (i) a first process material from the common source of first process material and (ii) a second process material from the common source of second process material, to a first blending manifold of the plurality of blending manifolds, wherein the first blending manifold is in fluid communication with a first processing station of the plurality of processing stations to generate a first blend of process materials;
- performing a first processing step on the semiconductor or microelectronic device at the first processing station utilizing the first blend;
- independently regulating supply of each of (i) a third process material from a common source of third process material and (ii) either (a) a fourth process material from a common source of fourth process material or (b) the first process material from the common source of first process material, to the first blending manifold in fluid communication with the first processing station to generate a second blend of process materials; and
- performing a second processing step on the semiconductor or microelectronic device at the processing station utilizing the second blend, wherein the second processing step follows the first processing step without substantial interruption.

19. A method utilizing the system of claim 1 for supplying process material to a first and a second microelectronic device manufacturing process tool, with each semiconductor or microelectronic device manufacturing process tool having a plurality of semiconductor or microelectronic device processing stations, the method comprising:
- independently regulating supply of each of (i) first process material from the common source of first process material and (ii) a second process material from the common source of second process material, to a first blending manifold of the plurality of blending manifolds that is in fluid communication with a first selected discrete station of the plurality of semiconductor or microelectronic processing stations to generate a first blend of said first process material and said second process material provided to the first selected station;
- independently regulating supply of each of (i) a first process material from the common source of first process material and (ii) a third process material from a common source of third process material, to a second blending manifold of the plurality of blending manifolds that is in fluid communication with a second selected discrete station of the plurality of semiconductor or microelectronic processing stations to generate a second blend of said first process material and said third process material provided to the second selected station;
- changing said supply of any of said first process material and said second process material to said first blending manifold to alter composition of said first blend provided to the first selected discrete station during processing of a first semiconductor or microelectronic device therein; and
- changing said supply of any of said first process material and said second process material to said second blending manifold to alter composition of said second blend provided to the second selected discrete station during processing of a second semiconductor or microelectronic device therein.

* * * * *